United States Patent
Taylor

(10) Patent No.: US 12,136,903 B2
(45) Date of Patent: Nov. 5, 2024

(54) POWER AMPLIFIER AND DEMODULATOR

(71) Applicant: Grant Taylor, North York (CA)

(72) Inventor: Grant Taylor, North York (CA)

( * ) Notice: Subject to any disclaimer, the term of this patent is extended or adjusted under 35 U.S.C. 154(b) by 503 days.

(21) Appl. No.: 17/552,650

(22) Filed: Dec. 16, 2021

(65) Prior Publication Data
US 2022/0109412 A1 Apr. 7, 2022

Related U.S. Application Data

(63) Continuation-in-part of application No. 16/899,173, filed on Jun. 11, 2020, now Pat. No. 11,211,908.

(60) Provisional application No. 62/861,397, filed on Jun. 14, 2019.

(51) Int. Cl.
*H03F 3/217* (2006.01)

(52) U.S. Cl.
CPC ..... *H03F 3/2171* (2013.01); *H03F 2200/333* (2013.01)

(58) Field of Classification Search
CPC ........................................... H03F 3/217
USPC ............................................. 330/251, 207 A
See application file for complete search history.

(56) References Cited

U.S. PATENT DOCUMENTS

| | | | | |
|---|---|---|---|---|
| 7,378,902 | B2 * | 5/2008 | Sorrells | H03F 1/32 330/124 R |
| 7,414,469 | B2 * | 8/2008 | Sorrells | H03F 1/02 330/124 R |
| 2010/0097138 | A1 * | 4/2010 | Sorrells | H03F 1/0261 330/149 |
| 2012/0256684 | A1 * | 10/2012 | Sorrells | H03F 1/0294 330/69 |

* cited by examiner

*Primary Examiner* — Henry Choe
(74) *Attorney, Agent, or Firm* — Burris Law, PLLC

(57) ABSTRACT

A power amplifier is provided. The power amplifier comprises: a universal pulse converter configured to: receive at least one analog input; and modulate an in-phase component of the at least one analog input and a quadrature component of the at least one input signal; a processor configured to process the in-phase and quadrature components, the processor comprising: a clock configured to produce a clock signal; a pulse processor configured to remove non-essential information from the modulated in-phase and quadrature components; and a pulse converter configured to output a control signal based on a selected amplifier class; and a switching network configured to actuate one or more switches based on the control signal to output an amplified signal.

17 Claims, 13 Drawing Sheets

POWER AMPLIFIER AND DEMODULATOR

CROSS-REFERENCE TO RELATED APPLICATIONS

This application is a Continuation-in-Part application of U.S. patent application Ser. No. 16/899,173 filed on Jun. 11, 2020, which claims priority to and the benefit of U.S. Provisional Application No. 62/861,397 filed on Jun. 14, 2019. The disclosure of the above applications is incorporated herein by reference.

FIELD

The present disclosure relates generally to amplifiers, and in particular, to a power amplifier.

BACKGROUND

The statements in this section merely provide background information related to the present disclosure and may not constitute prior art.

A power amplifier is an electronic device that may increase the power of an input signal. Generally, a power amplifier increases an amplitude of the input signal applied to input terminals of the power amplifier to produce a proportionally greater amplitude output signal at output terminals of the power amplifier. A power amplifier will hereafter be referred to as simply "amplifier".

There exists several different amplifier classes. Amplifier classes generally indicate an amount of time an amplifier is passing current such that amplifier classes are defined by a length of their conduction states over some portion of the output signal.

For example, Class A amplifiers conduct current through all of a cycle of the input signal. One hundred percent (100%) of the input signal is conducted through the entire cycle of current of the input signal. Therefore, Class A amplifiers conduct current through 360 degrees ($2\pi$) of the input signal.

Class B amplifiers conduct current only half of a cycle of the input signal. The input signal is conducted through half of the cycle of current of the input signal. Therefore, Class B amplifiers conduct current through 180 degrees ($\pi$) of the input signal.

Class C amplifiers conduct current for much less than half of a cycle of the input signal. The input signal is conducted through much less than half of a cycle of the current of the input signal. Generally, Class C amplifier conduct current through approximately 3 degrees of the input signal.

Class A, B and C amplifiers are linear gain amplifiers. Switching amplifiers also exist. An exemplary switching amplifier is a Class D amplifier. In Class D amplifiers, current is conducted in a switching manner. Specifically, the fraction of time that the input signal is conducted is adjusted such that a Pulse Width Modulation (PWM) output signal is output.

Although amplifiers are known, improvements are desired. It is therefore an object to provide a novel amplifier.

SUMMARY

This section provides a general summary of the disclosure and is not a comprehensive disclosure of its full scope or all of its features.

It should be appreciated that this Summary is provided to introduce a selection of concepts in a simplified form that are further described below in the Detailed Description of Embodiments. This Summary is not intended to be used to limit the scope of the claimed subject matter.

Accordingly, in an aspect, there is provided a power amplifier comprising: an in-phase modulator configured to modulate an in-phase component of an input signal; a quadrature modulator configured to modulate an quadrature component of the input signal; a processor configured to process the in-phase and quadrature components, the processor comprising: a clock configured to produce a clock signal; a pulse processor configured to remove non-essential information from the modulated in-phase and quadrature components; and a pulse converter configured to select an amplifier class and output a control signal based on the selected amplifier class; and a switching network configured to actuate one or more switches based on the control signal to output an amplified signal.

In one or more embodiments, the power amplifier further comprises: a decomposer configured to decompose the input signal into the in-phase and the quadrature component.

In one or more embodiments, the in-phase modulator is configured to apply at least one of pulse phase modulation (PPM), pulse width modulation (PWM), pulse location modulation (PLM) and zero-crossing pulse width modulation (ZPWM).

In one or more embodiments, the quadrature modulator is configured to apply at least one of pulse phase modulation (PPM), pulse width modulation (PWM) and pulse location modulation (PLM).

In one or more embodiments, the pulse processor is configured to remove mirrored information from the modulated in-phase and quadrature components.

In one or more embodiments, the pulse converter is further configured to: determine a width of pulses in the modulated in-phase and quadrature components; and compare the determined width with the clock signal.

In one or more embodiments, the amplifier class is any one of Class D, Class E, Class P, Class Q, and Class O. In one or more embodiments, when the amplifier class is Class C, the pulse converter is configured to output the control signal to actuate the switching network to output the modulated in-phase component as the amplified signal. In one or more embodiments, when the amplifier class is Class D, the pulse converter is configured to output the control signal to actuate the switching network to output the modulated quadrature component as the amplified signal. In one or more embodiments, when the amplifier class is Class E, the pulse converter is configured to: control the in-phase and quadrature modulators to not apply any modulation; and output the control signal to actuate the switching network to output the in-phase and quadrature components as the amplified signal. In one or more embodiments, the processor further comprises a first delay circuit or exclusive or (XOR) circuit configured to output a first delay signal to the pulse converter. In one or more embodiments, the essential information of the modulated in-phase component forms a first signal, and wherein the pulse converter is configured to apply the first delay signal to the first signal to produce a third signal. In one or more embodiments, the essential information of the modulated quadrature component forms a second signal, and wherein the pulse converter is configured to apply the first delay signal to the second signal to produce a fourth signal. In one or more embodiments, when the amplifier class is Class P, the pulse converter is configured to output the control signal to actuate the switching network to output the first signal, second signal, third signal and fourth signal in a repeating signal as the amplified signal. In one or more embodiments, when the amplifier class is Class Q, the pulse converter is configured to output the control signal to actuate the switching network to output a combination of the first and second signals, and a combination of the third and fourth signals in a repeating signal as the amplified signal. In one or more embodiments, when the amplifier class is Class O, ZPWM is used in conjunction with a logic circuit to provide identities for positive and negative wave forms.

In one or more embodiments, the power amplifier further comprises: an output filter configured to filter the amplified signal output by the switching network. In one or more embodiments, the output filter is a band pass filter.

In one or more embodiments, the pulse converter is configured to further employ Class G amplification. In one or more embodiments, the pulse converter is configured to output a control signal to actuate the switching network to switch to a particular rail voltage.

In one or more embodiments, the processor further comprises a second delay circuit configured to output a second delay signal for negative feedback.

Accordingly, in another aspect, there is provided a method comprising: decomposing an input signal into components; modulating the components into modulated signals; processing the modulated signals; selecting an amplifier class based on the processed modulated signals; actuating a switching network based on the selected amplifier class; and outputting an amplified signal through the switching network.

In one or more embodiments, the method further comprises: filtering the amplified signal.

In one or more embodiments, the method further comprises: converting the amplified signal to a pulse width modulated signal.

In one or more embodiments, the components are an in-phase component and a quadrature component. In one or more embodiments, the in-phase component are quadrature components are offset by 90 degrees. In one or more embodiments, modulating the components comprises: modulating the in-phase component at an in-phase modulator; and modulating the quadrature component at a quadrature modulator.

In one or more embodiments, modulating comprises applying at least one of pulse phase modulation (PPM), pulse width modulation (PWM), pulse location modulation (PLM), and zero-crossing pulse width modulation (ZPWM) to the components.

In one or more embodiments, processing comprises processing the modulated signals to remove non-essential information. In one or more embodiments, processing the modulated signals to remove non-essential information comprises removing a mirror half of the modulated signals.

In one or more embodiments, processing comprises comparing pulse timing of the modulated signals with a clock signal to determine pulse width. In one or more embodiments, selecting the amplifier class based on the processed modulated signals comprises selecting the amplifier class based on the determined pulse width.

In one or more embodiments, selecting the amplifier class based on the processed modulated signals comprises selecting any one of Class D, Class E, Class O, Class P and Class Q power amplification.

In one or more embodiments, selecting the amplifier class based on the processed modulated signals comprises sending a control signal to the switching network to switches in the switching network.

In one or more embodiments, outputting the amplified signal through the switching network comprises outputting the modulated in-phase component and/or the modulated quadrature component. In one or more embodiments, the method further comprises: decoding the modulated in-phase and quadrature components. In one or more embodiments, the modulated in-phase and quadrature components comprises decoding the modulated in-phase and quadrature components to determine amplitude and phase information.

According to another aspect, there is provided a power amplifier comprising: a universal pulse converter configured to: receive at least one analog input; and modulate an in-phase component of the at least one analog input and a quadrature component of the at least one input signal; a processor configured to process the in-phase and quadrature components, the processor comprising: a clock configured to produce a clock signal; a pulse processor configured to remove non-essential information from the modulated in-phase and quadrature components; and a pulse converter configured to output a control signal based on a selected amplifier class; and a switching network configured to actuate one or more switches based on the control signal to output an amplified signal.

In one or more embodiments, the amplifier class is any one of Class D, Class E, Class O, Class P and Class Q. When the amplifier class is Class O, the pulse converter is configured to modulate in-phase and out of phase inputs signals, and logically combine the modulated in-phase and out of phase inputs signals to determine positive and negative identities. In one or more embodiments, the modulated in-phase and out of phase signals are logically combined by: inputting the modulated in-phase and out of phase signals to an XOR to produce an output; inputting the modulated in-phase signal along with the output of the XOR gate to a first AND gate to provide a positive identity; and inputting the modulated out of phase signal along with the output of the XOR gate to a second AND gate to provide a negative identity.

In one or more embodiments, the clock is configured to produce the clock signal having a resolution of $x^2$, where x is greater than or equal to 2. In one or more embodiment, the clock is implemented using a Johnson ring counter.

It should be appreciated that this Summary is provided to introduce a selection of concepts in a simplified form that are further described below in the Detailed Description. This Summary is not intended to be used to limit the scope of the claimed subject matter.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 15A:
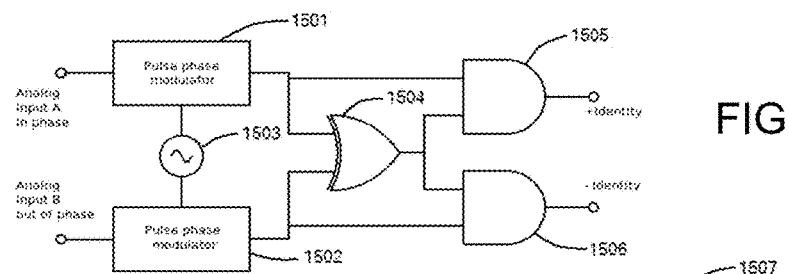
Figure 15B:
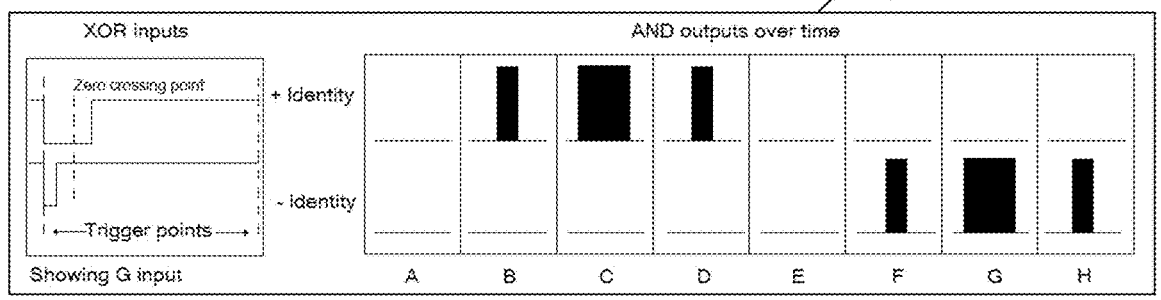
Figure 16A:
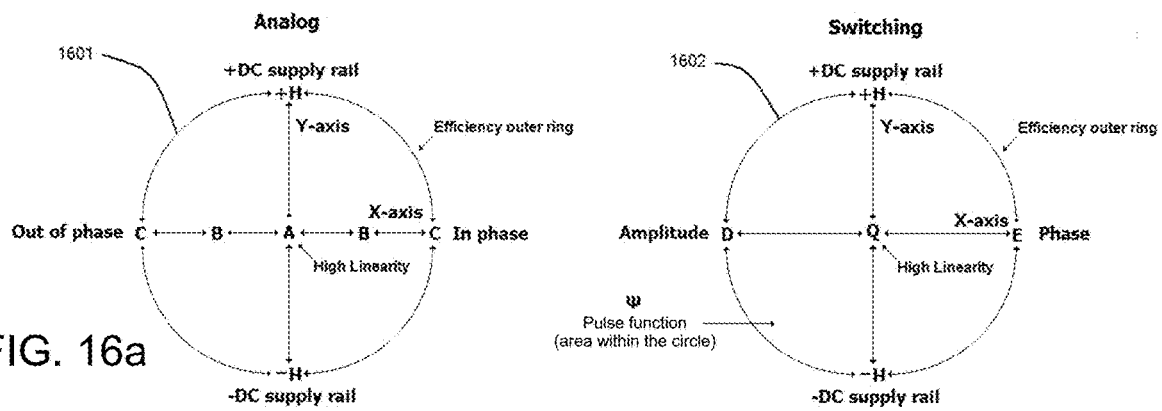
Figure 16B:
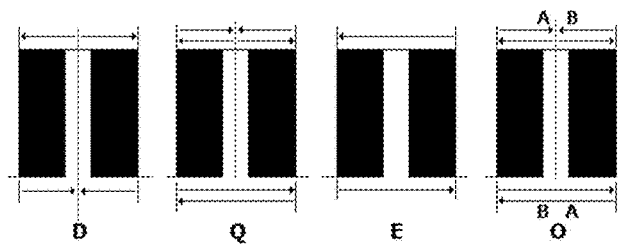
Figure 17:
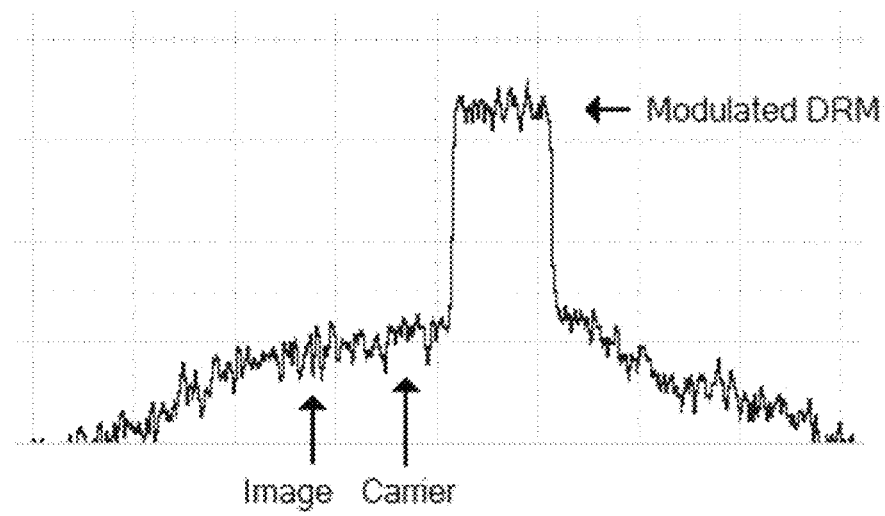

FIG. 15*a* is a circuit diagram exemplifying a circuit for implement a Class O of the power amplifier;

FIG. 15*b* is a schematic diagram illustrating output of the circuit diagram in FIG. 15*a*, identity processing logic blocks;

FIG. 16*a* is a diagram illustrating properties of different amplifier classes;

FIG. 16*b* is a graphical representation of the pulse types for different classes; and FIG. 17 is a graph representing a double balance mixer out.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The foregoing summary, as well as the following detailed description of certain embodiments will be better understood when read in conjunction with the accompanying drawings. As will be appreciated, like reference characters are used to refer to like elements throughout the description and drawings. As used herein, an element or feature recited in the singular and preceded by the word "a" or "an" should be understood as not necessarily excluding a plural of the elements or features. Further, references to "one example" or "one embodiment" are not intended to be interpreted as excluding the existence of additional examples or embodiments that also incorporate the recited elements or features of that one example or one embodiment. Moreover, unless explicitly stated to the contrary, examples or embodiments "comprising", "having" or "including" an element or feature or a plurality of elements or features having a particular property may further include additional elements or features not having that particular property. Also, it will be appreciated that the terms "comprises", "has" and "includes" mean "including but not limited to" and the terms "comprising", "having" and "including" have equivalent meanings.

As used herein, the term "and/or" can include any and all combinations of one or more of the associated listed elements or features.

It will be understood that when an element or feature is referred to as being "on", "attached" to, "connected" to, "coupled" with, "contacting", etc. another element or feature, that element or feature can be directly on, attached to, connected to, coupled with or contacting the other element or feature or intervening elements may also be present. In contrast, when an element or feature is referred to as being, for example, "directly on", "directly attached" to, "directly connected" to, "directly coupled" with or "directly contacting" another element of feature, there are no intervening elements or features present.

It will be understood that spatially relative terms, such as "under", "below", "lower", "over", "above", "upper", "front", "back" and the like, may be used herein for ease of describing the relationship of an element or feature to another element or feature as depicted in the figures. The spatially relative terms can however, encompass different orientations in use or operation in addition to the orientation depicted in the figures.

Reference herein to "example" means that one or more feature, structure, element, component, characteristic and/or operational step described in connection with the example is included in at least one embodiment and or implementation of the subject matter according to the present disclosure. Thus, the phrases "an example," "another example," and similar language throughout the present disclosure may, but do not necessarily, refer to the same example. Further, the subject matter characterizing any one example may, but does not necessarily, include the subject matter characterizing any other example.

Reference herein to "configured" denotes an actual state of configuration that fundamentally ties the element or feature to the physical characteristics of the element or feature preceding the phrase "configured to".

Unless otherwise indicated, the terms "first," "second," etc. are used herein merely as labels, and are not intended to impose ordinal, positional, or hierarchical requirements on the items to which these terms refer. Moreover, reference to a "second" item does not require or preclude the existence of lower-numbered item (e.g., a "first" item) and/or a higher-numbered item (e.g., a "third" item).

As used herein, the terms "approximately" and "about" represent an amount close to the stated amount that still performs the desired function or achieves the desired result. For example, the terms "approximately" and "about" may refer to an amount that is within less than 10% of, within less than 5% of, within less than 1% of, within less than 0.1% of, or within less than 0.01% of the stated amount.

Figure 1:
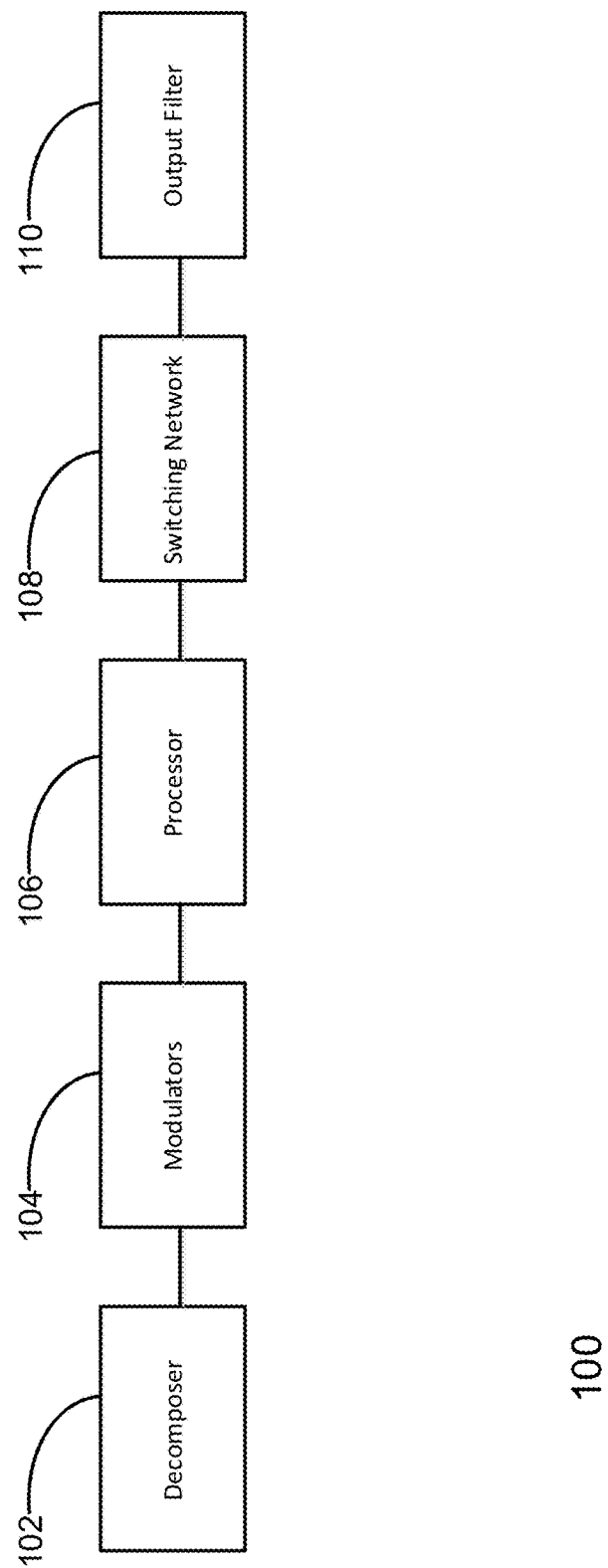
FIG. 1 is a block diagram of a power amplifier in accordance with an aspect of the disclosure.
Figure 2:
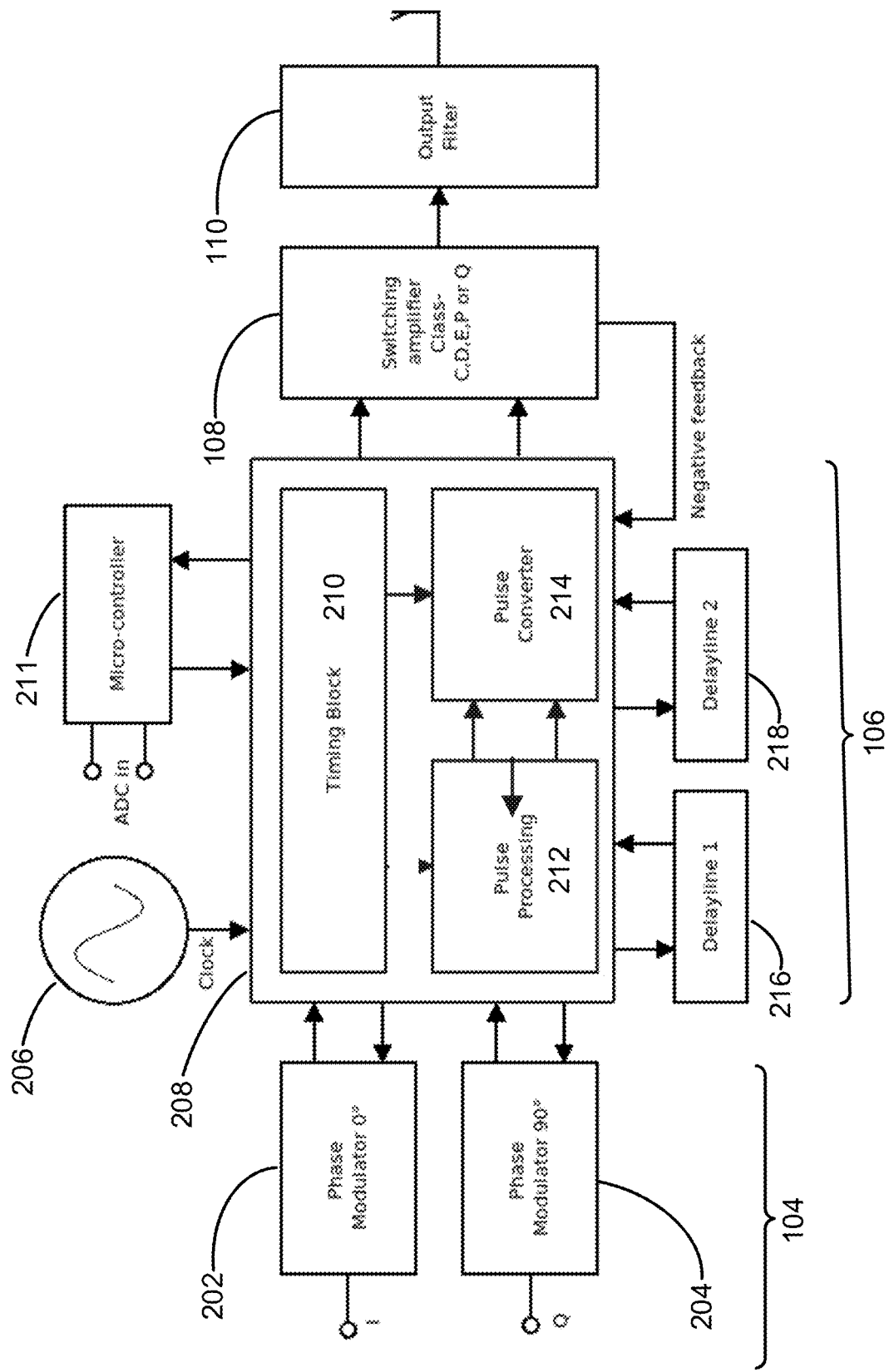
FIG. 2 is another block diagram of a portion of the power amplifier of FIG. 1.

FIGS. 1 and 2 shows a power amplifier in accordance with an aspect of the disclosure generally identified by reference numeral 100. The power amplifier 100 is configured to produce signals of greater resolution than prior art power amplifiers as will be described. The power amplifier 100 comprises a decomposer 102, modulators 104, processor 106, a switching network 108 and an output filter 110. The decomposer 102 is electrically connected to the modulators 104. The modulators 104 are electrically connected to the decomposer 102. The modulators 104 are electrically connected to the processor 106. The processor 106 is electrically connected to the modulators 104. The processor 106 is electrically connected to the switching network 108. The switching network 108 is electrically connected to the processor 106. The switching network 108 is electrically connected to the output filter 110. The output filter 110 is electrically connected to the switching network 108.

As shown in FIG. 2, the processor 106 comprises a clock 206, an integrated circuit 208, a microcontroller 211, a first delay circuit 216 and a second delay circuit 218. The first delay circuit 216 and/or the second delay circuit 218 can be made up a single or multiple delay lines, where a pulse or pulses are delayed so as to be processed within another time slot. In this embodiment, the integrated circuit 208 is a field programmable gate array (FPGA). The clock 206 is electrically connected to the FPGA 208. The FPGA 208 is electrically connected to the modulators 104. The FPGA 208 is electrically connected to the switching network 108. The first delay circuit 216 is electrically connected to the FPGA 208. The second delay circuit is electrically connected to the FPGA 208. The FPGA 208 comprises a timer 210, a pulse processor 212 and a pulse converter 214. The timer 210 is electrically connected to the pulse processor 212. The timer 210 is electrically connected to the pulse converter 214. The pulse processor 212 is electrically connected to the timer 210. The pulse processor 212 is electrically connected to the pulse converter 214. The pulse converter 214 is electrically connected to the timer 210. The pulse converter 214 is electrically connected to the pulse processor 212.

The decomposer 102 is configured to receive the input signal. The decomposer 102 is configured to decompose the input signal into an in-phase component and a quadrature component. The in-phase and quadrature components are offset by one-quarter cycle (90 degrees, $\pi/2$ radius). Specifically, the in-phase component is at 0 degrees and the quadrature component is at 90 degrees. The in-phase component carries the amplitude information of the input signal. The quadrature component carries the frequency and phase information of the input signal. The decomposer 102 is further configured to output the in-phase and the quadrature components using analog circuitry or digital gates. For example, in compatible quadrature amplitude modulation (C-QuAM), the sum and difference audio signals can be done in op-amps.

The modulators 104 are generally configured to modulate the decomposed in-phase and quadrature components of the input signal. The modulators 104 are configured to receive the in-phase and quadrature components. In this embodiment, the modulators 104 comprise two modulators: an in-phase modulator 202 that is configured to receive the in-phase component I and a quadrature modulator 204 that is configured to receive the quadrature component Q. The modulators 202 and 204 are configured to modulate the two components to produce two pulsed signals. The modulators 202 and 204 are electrically connected to the clock 206 of the processor 106. The modulators 202 and 204 utilize a clock signal generated by the clock 206 to modulate the in-phase and quadrature components. In this embodiment, each of the in-phase and quadrature modulators 202 and 204, respectively, are pulse phase modulators that are configured to apply PPM to the in-phase and quadrature components. In another embodiment, the in-phase and quadrature modulators 202 and 204, respectively, are pulse width modulators that are configured to apply PWM to the in-phase and quadrature components. The in-phase modulator 202 is configured to output a modulated in-phase component signal to the processor 106. The quadrature modulator 204 is configured to output a modulated quadrature component signal to the processor 106.

The in-phase and quadrature modulators 202 and 204, respectively, are further configured to selectively apply PWM to the in-phase and quadrature components. When PWM is selected, the modulated in-phase and quadrature component signals are generated by applying PWM.

The processor 106 is generally configured to process the modulated in-phase and quadrature pulse components. The processor 106 is configured to receive the modulated in-phase and quadrature components as pulse functions.

The clock 206 is configured to produce the clock signal that utilized by the timer 210, pulse processor 212 and pulse converter 214 to process the modulated in-phase and quadrature component pulsed signals. The clock 206 is further configured to produce the clock signal that is utilized by the in-phase and quadrature modulators 202 and 204 as sine and cosine parts, respectively, to modulate the in-phase and quadrature components, respectively.

The timer 210 is configured to receive the modulated in-phase and quadrature component signals. The timer 210 is further configured to receive the clock signal from the clock 206. The timer 210 is configured to provide a gating window to ensure the pulses of the modulated in-phase and quadrature component signals are kept in their respective correct time slots. The timer 210 is further configured to provide phase offsets to ensure the pulses of the modulated in-phase and quadrature component signals are kept at the correct phase. In this embodiment, the timer 201 utilizes two oscillators: a fixed reference oscillator and a pre-setable oscillator.

Figure 3:
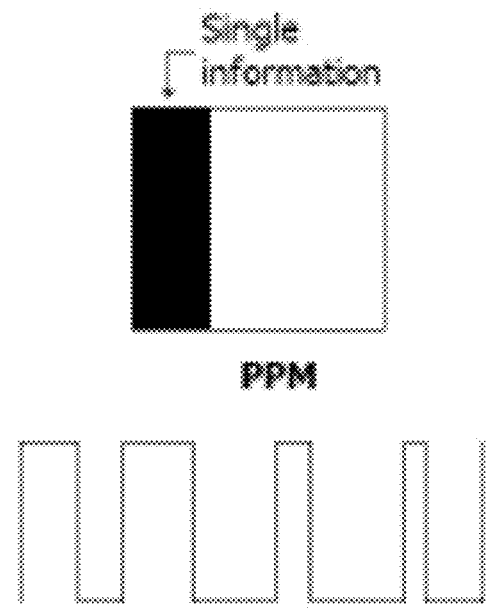
FIG. 3 is a pulse waveform of a pulse width modulation (PWM) signal.

The pulse processor 212 is configured to receive the modulated in-phase and quadrature component signals. The pulse processor 212 is configured to receive signals from the timer 210. The pulse processor 212 is configured to receive the clock signal from the clock 206. The pulse processor 212 is configured to remove non-essential information from the modulated in-phase and quadrature component signals. As previously stated, the modulated in-phase and quadrature component signals are generated by applying PPM. Turning now to FIG. 3, a pulse waveform of a PPM signal is shown. As shown in FIG. 3, in PPM, the essential information of the modulated in-phase and quadrature component signals is at the start of the pulse waveform. As previously stated, the pulse processor 212 is configured to remove non-essential information from the modulated in-phase and quadrature component signals. The pulse processor 212 is configured to remove the latter portion of the pulse waveform leaving only the essential information. Specifically, the pulse processor 212 is configured to utilize the clock signal from the clock 206 via the timer 210 to gate out the non-essential information from the modulated in-phase and quadrature component signals. As there could be a delay between start of the pulse and the end of the pulse where modulated information is located, therefore the unwanted part of the pulse is gated out when it falls into the wanted time slot.

Figure 4:
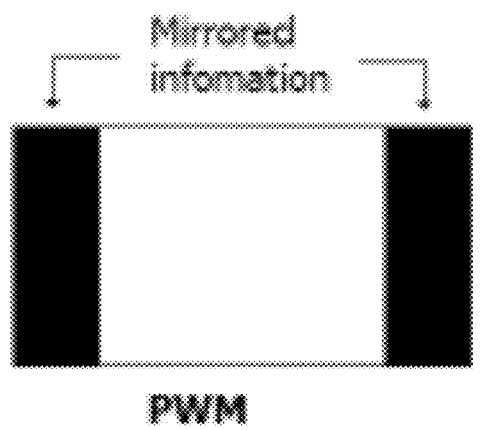
FIG. 4 is a pulse waveform of a pulse phase modulation (PPM) signal.
Figure 4:
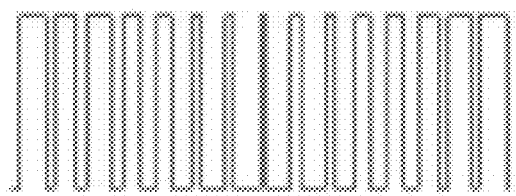

As previously stated, the in-phase and quadrature modulators 202 and 204, respectively, may selectively apply PWM to the in-phase and quadrature components. When PWM is selected, the modulated in-phase and quadrature component signals are generated by applying PWM. Turning now to FIG. 4, a pulse waveform of a PWM signal is shown. As shown in FIG. 4, in PWM, the essential information of the modulated in-phase and quadrature component signals is at the start of the pulse waveform. Furthermore, the pulse waveform has mirrored information i.e. the essential information is present on both sides of the pulse waveform, but mirrored or 180 degrees out of phase. The pulse processor 212 is configured to remove the latter half (or initial half) or the pulse waveform thereby removing the mirrored information. The pulse processor 212 is further configured to remove the latter portion of the half pulse waveform (or initial portion) leaving only the essential information.

The pulse converter 214 is configured to receive the essential information from the pulse processor. Specifically, the pulse converter 214 is configured to receive the essential information of the modulated in-phase component signal and the essential information of the modulated quadrature component signal. The essential information of the modulated in-phase component signal will hereafter be referred to a first signal. The essential information of the modulated quadrature component signal will hereafter be referred to a second signal.

The pulse converter 214 is further configured to receive the modulated in-phase and quadrature component signals from the in-phase and quadrature modulators 202 and 204, respectively. Depending on the amplifier class selected by the pulse converter 210, the pulse converter 210 may output the modulated in-phase and quadrature component signals to the switching network 108 as will be described.

The pulse converter 214 is configured to receive signals from the timer 210. The pulse converter 214 is configured to receive the clock signal from the clock 206. The pulse converter 214 is configured to compare pulse timing of the first signal and second signals with the received clock signal to determine the width and position of the pulses. In an embodiment, the pulse converter is in communication with the microcontroller 211. The microcontroller 211 includes one or more analog-to-digital converters (ADCs). Accordingly, the in-phase and quadrature component signals, or inputted component signals, are input into the microcontroller 211 and converted to a digital form. The microcontroller 211 is programmed to set the mode of operation of type of amplification and output a control signal back to the FPGA using an appropriate interface, such as a serial or a parallel interface, for example. The control signal is used to control the function of the pulse processor 212 and pulse converter 214, providing for real time optimization of these components. In a basic configuration of the FPGA 208, the microcontroller can be omitted and the modulator and/or amplifier are in a fixed mode of operation. Depending on the determined width of the pulses, the pulse converter 214 is configured to select a particular amplifier class. The pulse converter 214 may select the Class C, Class D, Class E, Class P, Class O or Class Q amplifier class. The pulse converter 214 may employ the Class G or H amplifier class in addition to the selected amplifier class as will be described. Class O, Class P and Class Q amplifier classes will be described. Once the pulse converter 214 selects an amplifier class, the pulse converter 214 is configured to output a control signal to the switching network 108 to actuate select switches of the switching network 108 to receive an amplified signal for the selected amplifier class as will be described. The pulse converter 214 is configured to output the amplified signal to the switching network 108 depending on the amplifier class selected.

In this embodiment, the pulse converter 214 is further configured to receive a first delay signal from the first delay circuit 216. The pulse converter 214 is configured to apply the first delay signal to the first signal to produce a third signal offset by 180 degrees from the first signal. The pulse converter 214 is further configured to apply the first delay signal to the second signal to produce a fourth signal offset by 180 degrees from the second signal. In this manner, the pulse converter 214 may have a maximum of four signals: the first signal at 0 degrees, the second signal at 90 degrees, the third signal at 180 degrees which is the delayed first signal and the fourth signal at 270 degrees which is the delayed second signal.

In this embodiment, the pulse converter 214 is further configured to receive a second delay signal from the second delay circuit 218. The second delay signal is utilized for negative feedback to align the modulators 202 and 204.

The switching network 108 is configured to receive the control signal from the pulse converter 214. The switching network 108 is configured to receive pulses to be amplified at the output. The switching network 108 is further configured to receive the first signal, the second signal, the third signal and the fourth signal. In this embodiment, the switching network 108 comprises two (2) switches. Each switch of the switching network 108 is controlled by the control signal output by the pulse converter 214. As will be described the two (2) switches of the switching network 108 are configured to be actuated (open or closed) to produce the selected amplifier class. The two (2) switches of the switching network 108 are configured to output the amplified signal for the selected amplifier class as will be described. In this embodiment, the two switches are a laterally diffused metal oxide semiconductor (LDMOS) device that has two transistors within a single package. As will be appreciated, only two switches are normally used, one for positive and the other for negative going parts of the waveform. However, other configurations are possible, including, for example, a stepped square wave (0, 1/2, 1) for light and a single switch for class C amplifier, or four switches for a form of class P amplifier.

The output filter 110 is configured to receive the amplified signal output via the switching network. The output filter 110 is configured to filter the amplified signal output by the switching network. The output filter 110 removes any unwanted harmonics from reaching a load or antenna system that may be connected to the output filter 110. In this embodiment, the output filter 110 is a low pass filter. In another embodiment, the output filter 110 is a band pass filter. As will be appreciated, the output filter 110 may not be required for optical or magnetic tape signal processing.

During operation, the analog input of the decomposer 102 receives the input signal to be amplified. The decomposer 102 decomposes the analog input signal into the in-phase component I and the quadrature component Q. The in-phase component is at 0 degrees and the quadrature component is at 90 degrees. The decomposer 102 outputs the in-phase and quadrature components to the pulse modulators 104. Specifically, the decomposer 102 outputs the in-phase component to the in-phase modulator 202. The decomposer 102 outputs the quadrature component to the quadrature modulator 204.

The in-phase modulator 202 applies PPM to the in-phase component to produce the modulated in-phase component signal. The in-phase modulator 202 outputs the modulated in-phase component signal to the pulse processor 212 and the pulse converter 214. The quadrature modulator 204 applies PPM to the quadrature component to produce the modulated quadrature component signal. The quadrature modulator 204 outputs the modulated quadrature component signal to the pulse processor 212 and the pulse converter 214.

The pulse processor 212 removes non-essential information from the modulated in-phase and quadrature component signals. In this embodiment, the pulse processor 212 removes the latter portions of the pulses that contains non-essential information of the modulated in-phase and quadrature component signals. The pulse processor 212 outputs the essential information of the modulated in-phase component signal (first signal) and the essential information of the modulated quadrature component signal (second signal).

The pulse converter 214 receives the first and second signals from the pulse processor 212. The pulse converter 214 receives the clock signal from the clock 206. The pulse converter 214 compares pulse timing of the first and second signals with the received clock signal to determine the width of the pulses. The pulse converter 214 selects a particular amplifier class depending on the width of the pulses of the first and second signals. In another embodiment, the pulse converter 214 selects a particular amplifier class depending on voltage levels of the pulses. The pulse converter 214 outputs a control signal to the switching network 108 to control the switches of the switching network 108.

The pulse converter 214 receives the first delay signal from the first delay circuit 216. The pulse converter 214 applies the first delay signal to the first signal to produce the third signal. The pulse converter 216 applies the first delay signal to the second signal to produce the fourth signal.

If Class C is selected, the pulse converter 214 outputs the modulated in-phase component signal to the switching network 108. Thus, the amplified signal is the modulated in-phase component signal. The pulse converter 214 outputs a control signal to the switches of the switching network 108 to output the modulated in-phase component signal to the output filter 110. The output filter 110 filters the modulated in-phase component signal to smooth the modulated in-phase component signal. While the amplified signal has been described as the modulated in-phase component signal, the amplified signal may instead be the modulated quadrature component signal.

If Class D is selected, the pulse converter 214 outputs a control signal to the in-phase modulator 202 and the quadrature modulator 204 to change modulation to PWM. The in-phase modulator 202 and the quadrature modulator 204 applies PWM to the in-phase component and outputs a modulated (PWM) in-phase component signal. The modulated (PWM) in-phase component signal is output by the pulse converter 214 directly through a switch in the switching network 108 to the output filter 110. Thus, the amplified signal is the modulated (PWM) in-phase component signal. The output filter 110 filters the modulated (PWM) in-phase component signal to smooth the modulated (PWM) in-phase component signal.

While the amplified signal has been described as the PWM in-phase component, the amplified signal may instead be the PWM quadrature component. With PWM modulation there may be a requirement to use one or more of base phase angles 0°, 90°, 180° and 270°. In this embodiment, the pulse converter 214 outputs a control signal to the quadrature modulator 204 to change modulation to PWM. The quadrature modulator 204 applies PWM to the quadrature component and outputs a modulated (PWM) quadrature component signal. The modulated (PWM) quadrature component signal is output by the pulse converter 214 directly through a switch in the switching network 108 to the output filter 110. Thus, the amplified signal is the modulated (PWM) quadrature component signal. The output filter 110 filters the modulated (PWM) quadrature component signal to smooth the modulated (PWM) quadrature component signal.

If Class E is selected, the pulse converter 214 outputs a control signal to the in-phase and quadrature modulators 202 and 204, respectively, to pass the decomposed input signal with partial modulation. Class E is selected for phase modulation (PM) or frequency modulation (FM). Specifically, the in-phase modulator 202 applies no modulation to the in-phase component. The quadrature modulator 204 modulates the quadrature component using phase or frequency modulation and outputs the modulated quadrature component signal. The in-phase and modulated quadrature component signals are output by the pulse converter 214 directly through one or more switches in the switching network 108 to the output filter 110. Thus, the amplified signal is the in-phase and modulated quadrature component signals. The output filter 110 filters the in-phase component signal to smooth the modulated quadrature component signal.

Figure 5:
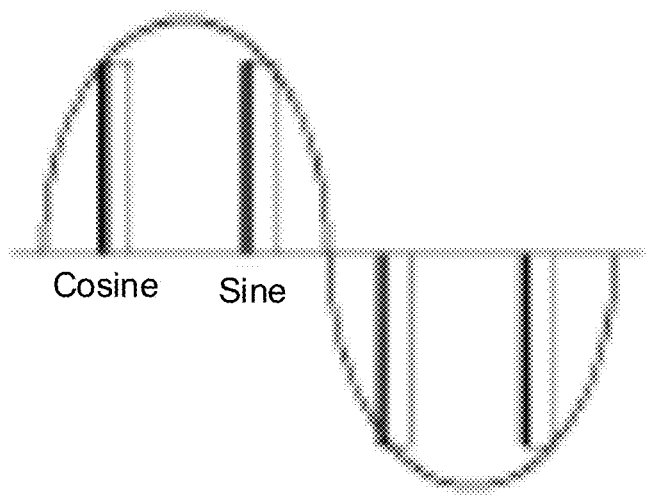
FIG. 5 is a pulse waveform of a repeating signal of Class P of the power amplifier of FIG. 1.

If Class P is selected, the pulse converter 214 outputs a control signal to the switches of the switching network 108 to output the first, second, third and fourth signals. The switches of the switching network 108 alternate between open and closed to pulse the first signal, second signal, third signal and fourth signal in a repeating signal. The first signal is the modulated in-phase component signal (+I). The second signal is the modulated quadrature component signal (+Q). The third signal is the 180 degree delayed first signal (−I). The fourth signal is the 180 degree delayed second signal (−Q). The first and second signals form the positive first half cycle of the repeating signal. The third and fourth signals form the negative second half cycle of the repeating signal. Thus, the amplified signal is the repeating signal of +I, +Q, −I and −Q. FIG. 5 shows a pulse waveform of the repeating signal of Class P. The pulse waveforms includes four distinct pulses (the four signals) of the repeating signal. The repeating signal is output by the switching network 108 to the output filter 110. The output filter 110 filters the repeating signal to smooth the repeating signal.

In Class P, the in-phase and quadrature components are alternating. As one of skill in the art will appreciate, the repeating signal may commence with the modulated quadrature component signal. In this embodiment, the repeating signal is +Q, +I, −Q and −I. Furthermore, the signal may commence with the delayed modulated in-phase or quadrature component signals, i.e. −I, −Q. +I and +Q or −Q, −I, +Q and +I. In all embodiments, the modulated in-phase and quadrature component signals are alternating. Thus, in Class P there are four pulses (samples) per repeating signal (waveform). Each pulse is less than or equal to a 25% duty cycle of the input signal. Information is modulated on one side of the pulse (PPM), either on the left or right side of each pulse.

If Class Q is selected, the pulse converter 214 outputs a control signal to the switches of the switching network 108 to output the first, second, third and fourth signals. The first and second signals (+I and +Q) are combined, and the third and fourth signals (−I and −Q) are combined. The switches of the switching network 108 alternate between open and closed to pulse a combination of the first and second signals, and a combination of the third and fourth signals in alternating halves of a repeating signal. The first and second combined signal forms the positive first half cycle of the repeating signal. The third and fourth combined signal forms the negative second half cycle of the repeating signal. Thus, the amplified signal is the repeating signal. Information is modulated on a rising or falling side of the positive and negative edges.

As with Class P, in Class Q, the in-phase and quadrature components are alternating. As one of skill in the art will appreciate, the repeating signal may commence with the modulated quadrature component signal, the delayed modulated in-phase component signal or the delayed modulated quadrature component signal, i.e. +Q+I and −Q−I; −I−Q and +I+Q; and −Q−I and +Q+I. In all embodiments, the combined in-phase and quadrature components are alternating. Furthermore, the duty cycle of equal combined pulse (e.g. +I+Q) is less than or equal to a 25% duty cycle of the input signal.

Figure 6:
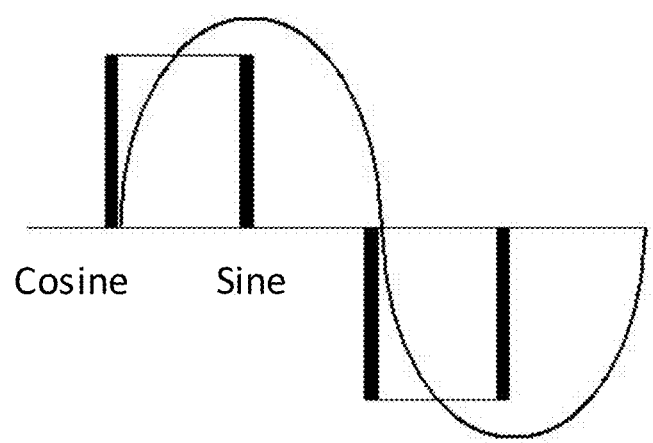
FIG. 6 is a pulse waveform of a repeating signal of Class Q of the power amplifier of FIG. 1.

FIG. 6 shows a pulse waveform of the repeating signal of Class Q. The pulse waveform is a stepped square wave. The stepped square wave is the combined first and third signals as one square pulse of the repeating signal, and the combined second and fourth signals as another square pulse of the repeating signal. As one of skill in the art will appreciate, the stepped square wave may be before or after the pulse edge. In FIG. 6, the stepped square wave is shown before the pulse edge. The repeating signal is output by the switching network 108 to the output filter 110. The output filter 110 filters the repeating signal to smooth the repeating pattern.

Unlike Class C, D and E, Class P and Q are forms of quadrature amplification as four signals are required. In quadrature amplification, four signals are required for amplification. Class P and Q use four pulses per cycle of the input signal. Class P uses four unique signals: the first signal at 0 degrees, the second signal at 90 degrees, the third signal at 180 degrees and the fourth signal at 270 degrees. Class Q uses four signals that are combined: the first and second signals at 0 and 90 degrees, respectively, and the third and fourth signals at 180 and 270 degrees, respectively. Furthermore, in quadrature amplification, amplitude information (the in-phase component, +I/−I), and phase or frequency (the quadrature component, +Q/−Q) are encoded into the pulse width in the form of PPM.

Figure 7:
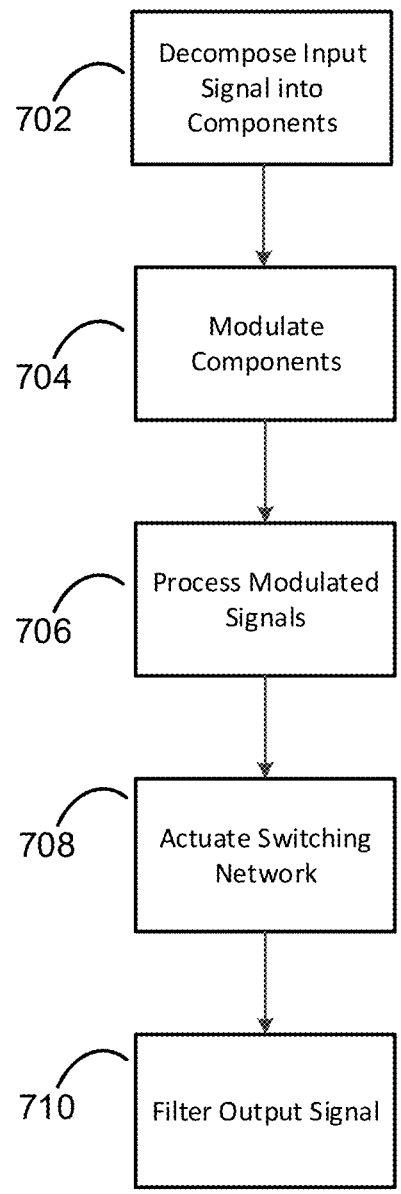
FIG. 7 is a flowchart of the operation of a power amplifier in accordance with an aspect of the disclosure.

Based on the voltage levels of the pulses, the pulse converter 214 may employ the Class G or H amplifier class in addition to the selected amplifier class. The pulse converter 214 outputs a control signal to the switching network 108 to switch to a particular DC supply rail based on the voltage levels of the pulses. This form of Glass G of H amplification provides improved power efficiency and may be used in conjunction with Class C, D, E, P and Q Turning now to FIG. 7, a flow chart of the operation of the power amplifier 100 in accordance with an aspect of the disclosure is shown. At step 702, an input signal is received at the decomposer 102. The decomposer 102 decomposes the input signal into an in-phase component and a quadrature component. As previously stated, the in-phase component is at 0 degrees and the quadrature component is at 90 degrees. The in-phase and quadrature components are then sent to the modulators 104.

At step 704, the components are modulated at the modulators 104. The modulators 104 utilize the clock signal transmitted from the clock 206 of the processor 106 to modulate the components. Specifically, the in-phase component is modulated at the in-phase modulator 202, and the quadrature component is modulated at the quadrature modulator 204. The in-phase modulator 202 may apply PPM or PWM. The quadrature modulator 204 may apply PPM or PWM. The modulated in-phase and quadrature components are output by the modulators 104 to the processor 106.

At step 706, the processor 106 processes the in-phase and quadrature components. The pulse processor 212 removes non-essential information from the modulated in-phase and quadrature pulse components. The pulse converter 214 selects an amplifier class and outputs a control signal to the switching network 108. The pulse converter 214 determines a width of the pulses in the modulated in-phase and quadrature components. The pulse converter 214 compares the determined width with the clock signal from the clock 206 to select the amplifier class. The amplifier class may be Class C, Class D, Class E, Class O, Class P or Class Q. Class Q is able shift between Classes D and E as Class Q has both amplitude and phase parts.

At step 708, the pulse converter 214 actuates switches in the switching network 108 to output an amplified signal. If the selected amplifier class is Class C, then the pulse converter outputs a control signal to the switching network 108 such that the amplified signal output by the switching network 108 is the modulated in-phase component.

If the selected amplifier class is Class D, then the pulse converter 214 outputs a control signal to the in-phase modulator 202 to change the modulation to PWM. Then the pulse converter outputs a control signal to the switching network 108 such that the amplified signal output by the switching network 108 is the modulated (PWM) in-phase component.

If the selected amplifier class is Class E, then the pulse converter 214 outputs a control signal to the switching network 108 such that the amplified signal output by the switching network 108 is the in-phase and quadrature components. In Class E, less than 50% of the input signal is used. Furthermore, in Class E more than 30% of the input signal is used in amplification. As such, Class E generally has a duty cycle of 30 to 50% of the input signal. As previously stated, in another embodiment, if Class E is selected, the modulators 202 and 204 apply PPM modulation converted to PLM. Alternatively, Class E can be implemented using phase modulation or frequency modulation by setting the pulse function to PLM.

If the selected amplifier class is Class P, then the pulse converter 214 applies the first delay signal from the first delay circuit 216 to the essential information of the modulated in-phase component (first signal) to produce the third signal. The pulse converter 214 further applies the first delay signal from the first delay circuit 216 to the essential information of the modulated quadrature component (second signal) to produce the fourth signal. The first signal is at 0 degrees (+I), the second signal is at 90 degrees (+Q), the third signal is at 180 degrees (−I) and the fourth signal is at 270 degrees (−Q). The pulse converter 214 outputs a control signal to the switching network 108 such that the amplified signal output by the switching network 108 is the first signal, second signal, third signal and fourth signal in a repeating signal (e.g. +I, +Q, −I and −Q). The first and second signals form the positive first half cycle of the repeating signal. The third and fourth signals form the negative second half cycle of the repeating signal. As previously stated, as long as the modulated in-phase and quadrature component signals are alternating variations of the repeating are possible.

If the selected amplifier class is Class Q, then the pulse converter 214 applies the first delay signal from the first delay circuit 216 to the essential information of the modulated in-phase component (first signal) to produce the third signal. The pulse converter 214 further applies the first delay signal from the first delay circuit 216 to the essential information of the modulated quadrature component (second signal) to produce the fourth signal. The first signal is at 0 degrees (+I), the second signal is at 90 degrees (+Q), the third signal is at 180 degrees (−I) and the fourth signal is at 270 degrees (−Q). The pulse converter 214 combines the first and second signals (+I and +Q), and the third and fourth signals (−I and −Q). The pulse converter 214 outputs a control signal to the switching network 108 such that the amplified signal output by the switching network 108 is the combination of the first and second signals, and the combination of the third and fourth signals in alternating halves of a repeating signal. In Class Q, less than a maximum of 30% of the input signal is used. Furthermore, in Class Q more than 0% of the input signal is used in amplification. In this embodiment, Class Q has a duty cycle of more than 0 to 25% of the input signal.

Class Q may further require phase trim prior to modulation. In another embodiment, the modulators 104 further comprise a phase trim network. The phase trim network is electrically connected to the in-phase and quadrature modulators 202 and 204, respectively. The phase trim network is further electrically connected to the decomposer 102. This can be done in the decomposer 102, by feeding in-phase and quadrature information back into the Class Q amplifier, where the quadrature part is mixed in with part of in-phase information and vice versa. Pulse modulators 202 and 204 phase performance can be improved using automatic phase control (APC) to offset unwanted temperature drift. This can be done with a negative feedback via an analog digital converter ADC, with micro-processor I controller, FPGA and digital to analog converter DAC.

If the selected amplifier class is Class O, then the pulse converter 214 selects in-phase and out of phase signals as input. Referring to FIG. 15, a circuit for implementing the Class O amplifier is illustrated. The in-phase signal is input to a first pulse phase modulator 1501. The out of phase signal is input to a second pulse phase modulator 1502. The first and second pulse phase modulators share a clock 1503. The modulated in-phase and out of phase signals are logically combined to determine a difference between the two signals.

In an embodiment, this is achieved using an exclusive OR (XOR) gate 1504 and a pair of AND gates 1505 and 1506. The modulated in-phase and out of phase signals are input to the XOR gate 1504. The modulated in-phase signal is input, along with the output of the XOR gate 1504 into a first AND gate 1505 to provide a positive identity. The modulated out of phase signal is input, along with the output of the XOR gate 1504 into a second AND gate 1506 to provide a negative identity. The AND gates 1505 and 1506 are configured as steering gates for the output to pass through, one or the other. The identities provide information as to the state the out at any given point in time, i.e. positive or negative. The output of the first and second pulse phase modulators 1501 and 1502 are the zero crossing pulse width modulation (ZPWM) signals. The phase modulators 1501 and 1502 are triggered at the same time, and the two analog inputs are set so that in time each output goes from logic low to a logic high from the centered zero-crossing point. Referring to FIG. 15b, an example of the input to the XOR gate 1504 and the corresponding output identities are shown. Reference A through to H show how the ZPWM changers over time, switching from one identity to the other via AND gates 1505 and 1506. As shown, in ZPWM the pulse moves from one edge across the zero crossing point to the opposite edge, where at the zero-crossing point both PPM inputs are nulled out. Switching is done at the same time with opposite angles, where split phase analog inputs are used. That is, the inputs to the first and second pulse phase modulators 1501 and 1502 are offset by 180°. In this case, the first pulse phase modulator 1501 and the second pulse phase modulator 1502 convert the analog inputs to PPM and the XOR gate 1504 subtracts the two PPM wave-forms. The first AND gate 1505 and the second AND gate 1506 set the identity that is then output to the switching device 108. The positive and negative identities are used to keep track of the waveform of the input signal as it changes from positive to negative across the zero-crossing point.

Class O can work with Classes D, E, G, H, I, P and Q, as all these classes may have positive and negative parts to them, where the identity is used to indicate if the waveform is positive or negative from the zero-crossing point.

The pulse converter 214 may then employ Class G and H amplification and switching rails for improved power efficiency.

The amplified signal is then output to the output filter 110.

In step 710, the amplified signal is filtered by the output filter 110. In this embodiment, the output filter 110 applies a low pass filter to the amplified signal to smooth the amplified signal.

Figure 8:
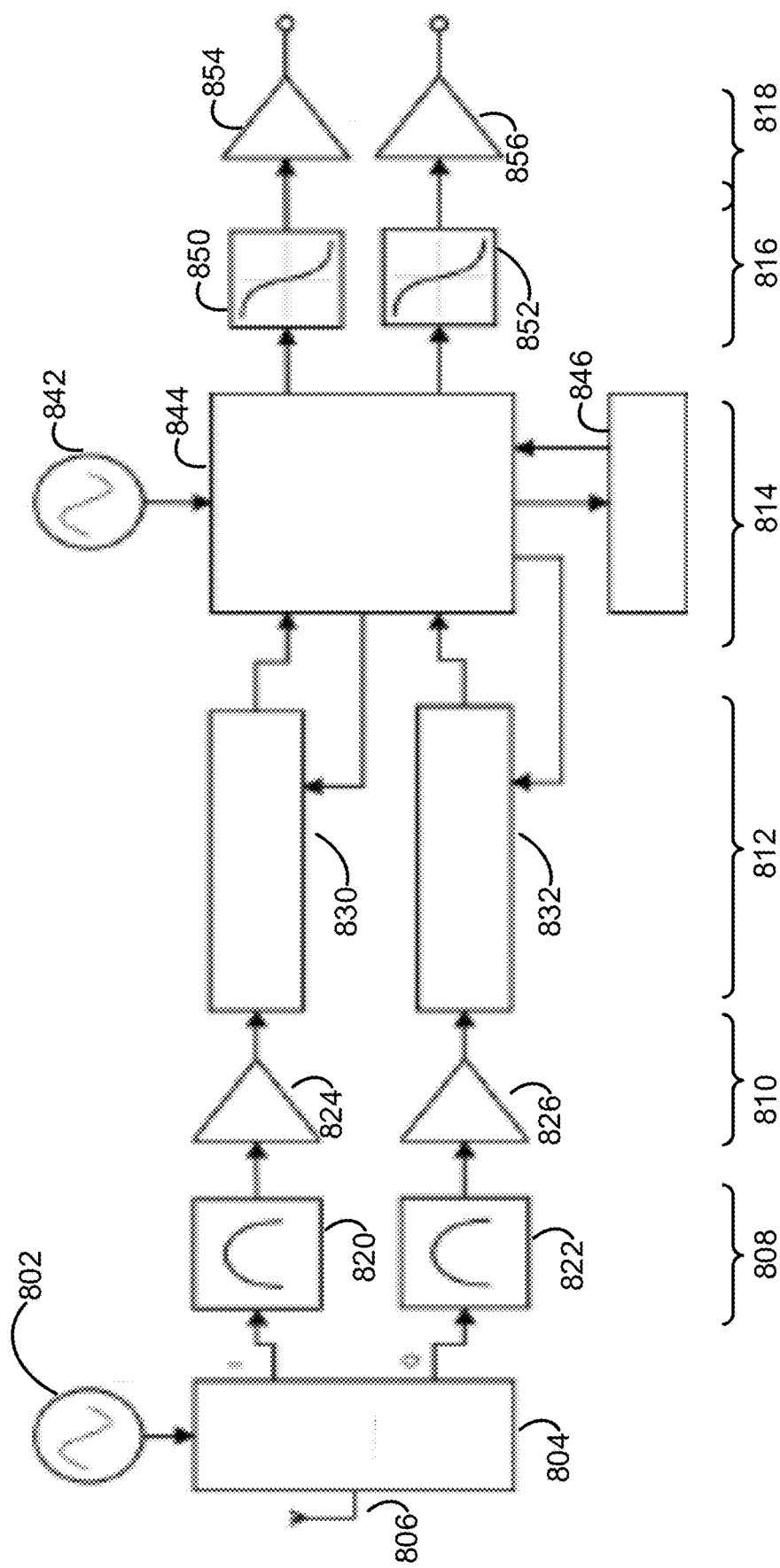
FIG. 8 is a block diagram of a demodulator in accordance with an aspect of the disclosure.

While a power amplifier 100 has been described, one of skill in the art will appreciate that the disclosure may be applied to a demodulator. FIG. 8 shows an embodiment of a demodulator in accordance with an aspect of the disclosure generally identified by reference numeral 800. The demodulator 800 comprises an oscillator 802, an mixer 804 having a radiofrequency (RF) antenna 806, input filters 808, operating amplifiers 810, modulators 812, a processor 814, output filters 816, and post-amplifiers 818.

The oscillator 802 is electrically connected to the mixer 804. The mixer 804 is electrically connected to the oscillator 802. The mixer 804 is electrically connected to the input filters 808. The input filters 808 are electrically connected to the mixer 804. The input filters 808 are electrically connected to the operating amplifiers 810. The operating amplifiers 810 are electrically connected to the input filters 808. The operating amplifiers 810 are electrically connected to the modulators 812. The modulators 812 are electrically connected to the operating amplifiers 810. The modulators 812 are electrically connected to the processor 814. The processor 814 is electrically connected to the modulators 812. The processor 814 is electrically connected to the output filters 816. The output filters 816 are electrically connected to the processor 814. The output filters 816 are electrically connected to the post-amplifiers 818. The post-amplifiers 818 are electrically connected to the output filters 816.

The oscillator 802 is configured to generate an oscillating signal for use in the mixer 804. The oscillator 802 is configured to output the oscillating signal to the mixer 804.

The mixer 804 is configured to receive an input signal via the RF antenna 806. The mixer 804 is configured to mixer the input signal utilizing the oscillating signal from the oscillator 802 to decompose the input signal into in-phase and quadrature components. The mixer 804 is configured to output the in-phase and quadrature components to the input filter 822.

The input filters 808 are configured to filter the decomposed in-phase and quadrature components. The input filters 808 are band pass filters. The input filters 808 comprises an in-phase band pass filter 820 and a quadrature band pass filter 822. The in-phase band pass filter 820 is electrically connected to the mixer 804. The in-phase band pass filter 820 is electrically connected to the operating amplifiers 810. The quadrature band pass filter 822 is electrically connected to the mixer 804. The quadrature band pass filter 822 is electrically connected to the operating amplifiers 810. The in-phase band pass filter 820 is configured to filter the in-phase component. The quadrature band pass filter 822 is configured to filter the quadrature component. The in-phase band pass filter 820 is configured to output the filtered in-phase component to the operating amplifiers 810. The quadrature band pass filter 822 is configured to output the filtered quadrature component to the operating amplifiers 810.

The operating amplifiers 810 are configured to amplify the filtered input signals such that further processing is possible. In this embodiment, there are two operating amplifiers 810. The operating amplifiers 810 comprise an in-phase operating amplifier 824 and an output operating amplifier 826. The in-phase operating amplifier 824 is electrically connected to the in-phase band pass filter 820. The in-phase operating amplifier 824 is electrically connected to the modulators 812. The quadrature operating amplifier 826 is electrically connected to the quadrature band pass filter 822. The quadrature operating amplifier 826 is electrically connected to the modulators 812. The in-phase operating amplifier 824 is configured to amplify the filtered in-phase component such that further processing is possible. The quadrature operating amplifier 826 is configured to amplify the filtered quadrature component such that further processing is possible. The in-phase operating amplifier 824 is configured to output the pre-amplified in-phase component to the modulators 812. The quadrature operating amplifier 826 is configured to output the pre-amplified quadrature component to the modulators 812.

The modulators 812 are configured to modulate input signals. The modulators 812 are configured to receive the pre-amplified in-phase and quadrature components. In this embodiment, the modulators 812 comprise two modulators: an in-phase modulator 830 and a quadrature modulator 832. The in-phase modulator 830 and the quadrature modulator 832 are identical to the previously described in-phase modulator 202 and the quadrature modulator 204, respectively, unless otherwise stated. The in-phase modulator 830 is configured to output the modulated in-phase component to the processor 814. The quadrature modulator 832 is configured to output the modulated quadrature component to the processor 814.

The processor 814 is configured to process the modulated in-phase and quadrature component. The processor 814 is configured to receive the modulated in-phase and quadrature components. The processor 814 comprises a clock 842, an FPGA 844 and a delay circuit 846. The clock 842 is electrically connected to the FPGA 844. The FPGA 844 is electrically connected to the clock 842. The FPGA 844 is electrically connected to the delay circuit 846. The delay circuit 846 is electrically connected to the FPGA 844. The clock 842 is identical to the previously described clock 206 unless otherwise stated. The FPGA 844 is identical to the previously described FPGA 208 unless otherwise stated. The delay circuit 846 is configured to generate a delay signal. The delay circuit 846 is configured to output the delay signal to the FPGA 844. The FPGA 844 is configured to receive the delay signal from the delay circuit 846. The FPGA 844 is configured to provide a ninety degree phase shift using the delay signal to combine the in-phase and quadrature pulses for signal processing.

While a single delay circuit 846 is shown, one of skill in the art will appreciate that two delay circuits may be used. The FPGA 814 is configured to output the amplified signals to the output filter 816. Furthermore, as one of skill in the art will appreciate, the in-phase modulator 830 and the quadrature modulator 832 may be configured to operate at two times the signal frequency. In this embodiment, the delay circuit 846 is not required.

The output filters 816 are configured to filter the amplified signals. The output filters 816 are configured to receive an in-phase amplified signal and a quadrature amplified signal. In this embodiment, the output filters 816 comprise an in-phase output filter 850 and a quadrature output filter 852. The in-phase output filter 850 is electrically connected to the processor 814. The in-phase output filter 850 is electrically connected to the post-amplifiers 818. The quadrature output filter 852 is electrically connected to the processor 814. The quadrature output filter 852 is electrically connected to the post-amplifiers 818. The in-phase output filter 850 is configured to filter the in-phase amplified signal. The quadrature output filter 852 is configured to filter the quadrature amplified signal. In this embodiment, the in-phase and quadrature output filters 850 and 852, respectively, are low pass filters. The in-phase output filter 850 is configured to output a filtered in-phase amplified component to the post-amplifiers 818. The quadrature output filter 852 is configured to output a filtered quadrature amplified component to the post-amplifiers 818.

The post-amplifiers 818 are configured to amplify the filtered amplified signals. The post-amplifiers 818 comprise an in-phase post-amplifier 854 and a quadrature post-amplifier 856. The in-phase post-amplifier 854 is electrically connected to the output filters 850, specifically, the in-phase output filter 850. The quadrature post-amplifier 856 is electrically connected to the output filters 850, specifically, the quadrature output filter 852. The in-phase post-amplifier 854 is configured to amplify the filtered in-phase amplified signal. The quadrature post-amplifier 854 is configured to amplify the filtered quadrature amplified signal.

Figure 9:
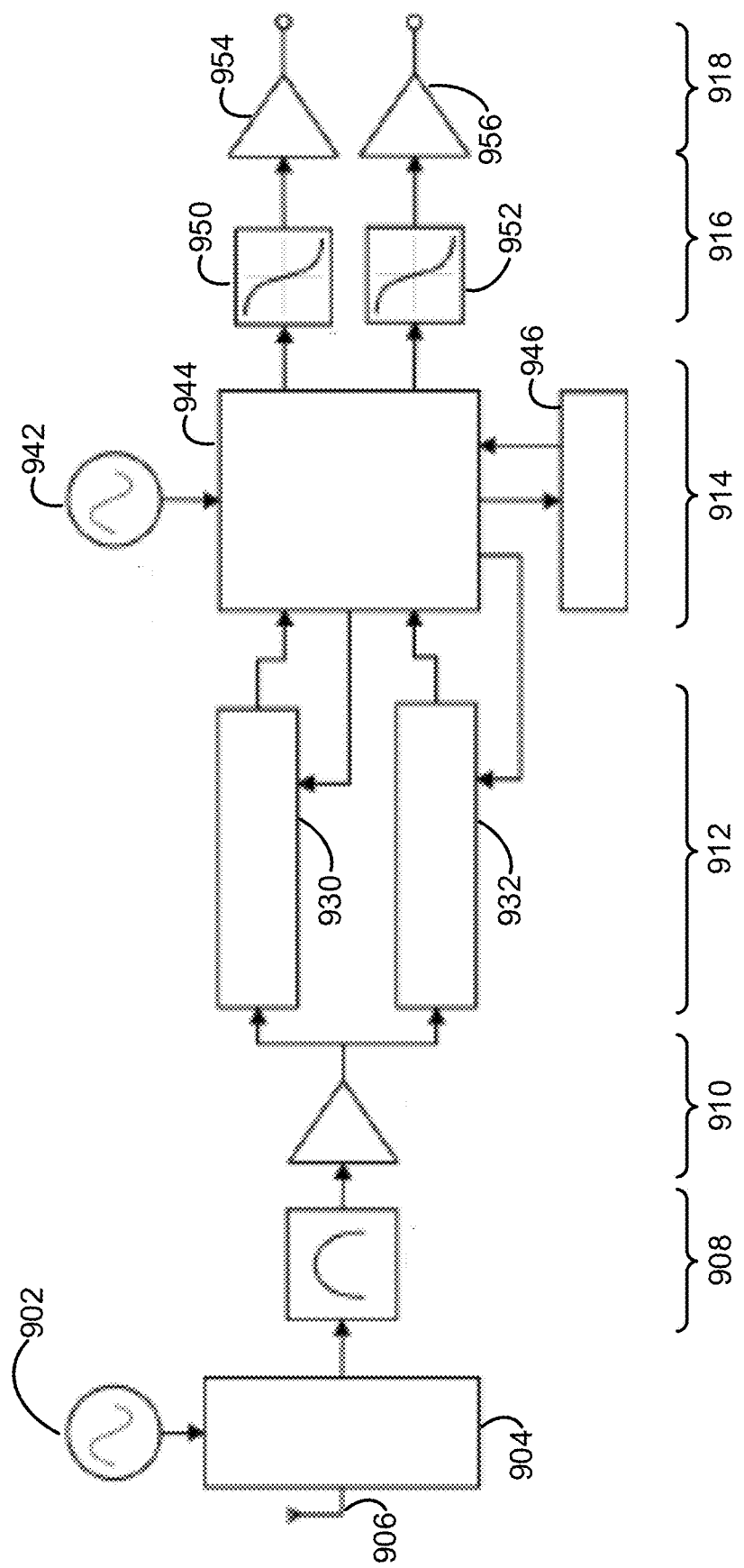
FIG. 9 is a block diagram of another demodulator in accordance with an aspect of the disclosure.

While a particular demodulator 800 has been described, one of skill in the art will appreciate that variations are possible. FIG. 9 shows another embodiment of a demodulator in accordance with an aspect of the disclosure generally identified by reference numeral 900. The demodulator 900 comprises an oscillator 902, an mixer 904 having a RF antenna 906, an input filters 908, a pre-amplifiers 910, modulators 912, a processor 914, output filters 916, and post-amplifiers 918.

The oscillator 902 is electrically connected to the mixer 904. The mixer 904 is electrically connected to the oscillator 902. The mixer 904 is electrically connected to the input filter 908. The input filter 908 is electrically connected to the mixer 904. The input filter 908 is electrically connected to the pre-amplifier 910. The pre-amplifier 910 is electrically connected to the input filter 908. The pre-amplifier 910 is electrically connected to the modulators 912. The modulators 912 are electrically connected to the pre-amplifier 910. The modulators 912 are electrically connected to the processor 914. The processor 914 is electrically connected to the modulators 912. The processor 914 is electrically connected to the output filters 916. The output filters 916 are electrically connected to the processor 914. The output filters 916 are electrically connected to the post-amplifiers 918. The post-amplifiers 918 are electrically connected to the output filters 916.

The oscillator 902, mixer 904 with the RF antenna 906, modulators 912, processor 914, outputs filter 916 and post-amplifiers 918 are similar to the previously described oscillator 802, mixer 804 with the RF antenna 806, modulators 812, processor 814, outputs filter 816 and post-amplifiers 818 unless otherwise stated, and will not be described further.

The input filter 908 is configured to filter the decomposed in-phase and quadrature components. The input filter 908 is band pass filter. The input filter 908 is configured to output the filtered component to the pre-amplifier 910.

The pre-amplifier 910 is configured to amplify the filtered components such that further processing is possible. The pre-amplifier 910 is configured to output the pre-amplified components to the modulators 812.

A simulation was performed of the power amplifier 100. In the simulation, the power amplifier 100 was configured to operate between 530 to 1900 KHz to encompass the 530 to 1700 kHz range of AM broadcast radio. Output power was set at a maximum of 100 W. At the output power of 100 W, peak efficiency was found to be 84% with a total harmonic distortion (THD) of less than 0.5 with a two tone test.

While a particular processor 106 has been described, one of skill in the art will appreciate that variations are possible.

In another embodiment, the processor 106 does not comprise the first and second delay circuits 216 and 218, respectively. In this embodiment, the in-phase and quadrature modulators 202 and 204, respectively, are configured to apply PPM to the in-phase and quadrature components at two (2) times the output frequency. Thus, signals at all four phase angles (0, 90, 180 and 270 degrees) are output by the in-phase and quadrature modulators 202 and 204, respectively. Specifically, the in-phase quadrature modulator 202 outputs the first and third signals at 0 and 180 degrees, respectively, and the quadrature modulator 204 outputs the second and fourth signals at 90 and 270 degrees, respectively.

While particular delay circuits 216 and 218 have been described, one of skill in the art will appreciate that variations are possible. In another embodiment, the first delay circuit 216 is looped such that more than a single delayed signal may be produced. In this embodiment, the pulse converter 214 receives the first delay signal from the first delay circuit 216 and applies the first delay signal to the first signal to produce the third signal. The pulse converter 214 further receives a third delay signal from the first delay circuit 216 and applies the third delay signal to the first signal to produce a fifth signal. Similarly, the pulse converter 214 receives the second delay signal from the second delay circuit 218 and applies the second delay signal to the second signal to produce the fourth signal. The pulse converter 214 further receives a fifth delay signal from the second delay circuit 218 and applies the fifth delay signal to the second signal to produce a sixth signal. The delay circuits 216 and 218 may therefore function as frequency multipliers.

While a particular processor 106 has been described, one of skill in the art will appreciate that variations are possible. In another embodiment, the processor 106 does not comprise the first delay circuit 216. In this embodiment, the modulators 202 and 204 operate at two times the frequency of the input signal. The modulators 202 and 204 can therefore output the first signal, second signal, third signal and fourth signal at 0, 90, 180 and 270 degrees, respectively, without the need for the first delay signal from the first delay circuits 216.

While a particular processor 106 has been described, one of skill in the art will appreciate that variations are possible. In another embodiment, the processor 106 does not comprise the second delay circuit 218. In this embodiment, no negative feedback signal is provided to the modulators 202 and 204.

While a particular switching network 108 has been described, one of skill in the art will appreciate that variations are possible. In another embodiment, the switching network 108 comprises at least one switching devices. In this embodiment, the switching devices are transistors. In this embodiment, the transistor is a LDMOS. In another embodiment, the switching network 108 comprises four transistors.

The power amplifier 100, and demodulators 800 and 900 described may be used in various applications. In an exemplary embodiment, the power amplifier 100 and/or demodulators 800 and 900 are utilized in the optical communication system described in U.S. patent application Ser. No. 16/288,814 filed on Feb. 28, 2019, the relevant portions of which are incorporated herein by reference. In another embodiment, the described amplifier 100, and demodulators 800 and 900 are used in an optical communication system or a communication system such as a radio. Furthermore, any of the amplifier 100, and demodulators 800 and 900 may be used at optical wavelengths or RF wavelengths. In other embodiments, the power amplifier 100 and demodulators 800 and 900 are used as audio amplifiers.

Figure 10:
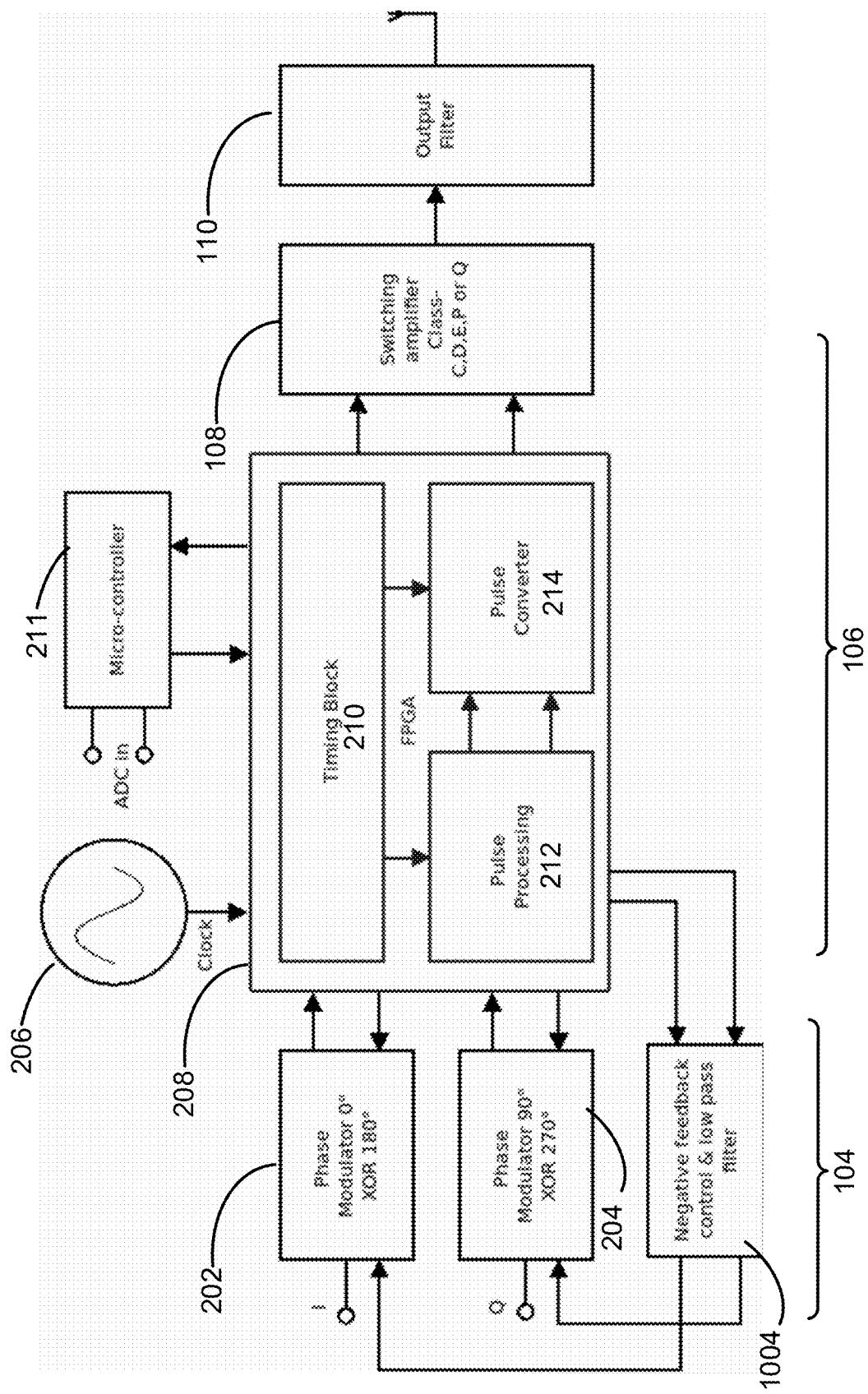
FIG. 10 is a block diagram of another power amplifier in accordance with an aspect of the disclosure.

In the embodiments described above, the pulse converter 214 is configured to apply the first delay signal to the first signal to produce a third signal offset by 180 degrees from the first signal. The pulse converter 214 is further configured to apply the first delay signal to the second signal to produce a fourth signal offset by 180 degrees from the second signal. In another embodiment, the third and fourth delay signals can be provided using exclusive or (XOR) multipliers. Referring to FIG. 10, the power amplifier using XOR multipliers is illustrated in accordance with another aspect of the disclosure. As shown in FIG. 10, an XOR multiplier is included in the in-phase modulator 202 to generate the 180 degree delay signal from the in-phase signal. Additionally, an XOR multiplier is included in the quadrature modulator 204 to generate the 270 degree delay signal from the quadrature signal. A negative feedback control 1004 is coupled between the integrated circuit 208 and the modulators 202 and 204. The processed pulses for the in-phase and quadrature signals are output to the negative feedback control 1004. The negative feedback control 1004 includes low pass filters that converts the pulses back into an analog wave form. The converted signals are out of phase with corresponding incoming analog signal. At this point the analog wave forms go through a phase shift network to balance out any unwanted phase offsets that have taken place within the integrated circuit 208. The resulting signals are then fed back into the corresponding phase modulators as an error correction to improve the amplifier linearity for optimum performance.

Figure 11:
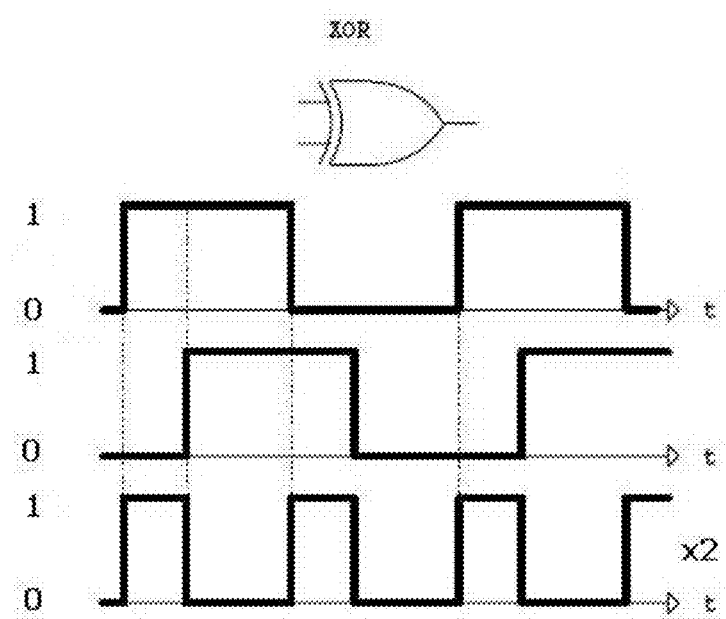
FIG. 11 is a pulse waveform illustrating XOR multiplication.

FIG. 11, illustrates how the XOR multiplier can be used as a doubler to convert two pulses into four. In accordance with an alternative aspect of the disclosure, the XOR multipliers are included in the pulse processor 212 rather than the in-phase modulator 202 and quadrature modulator 204.

Figure 12:
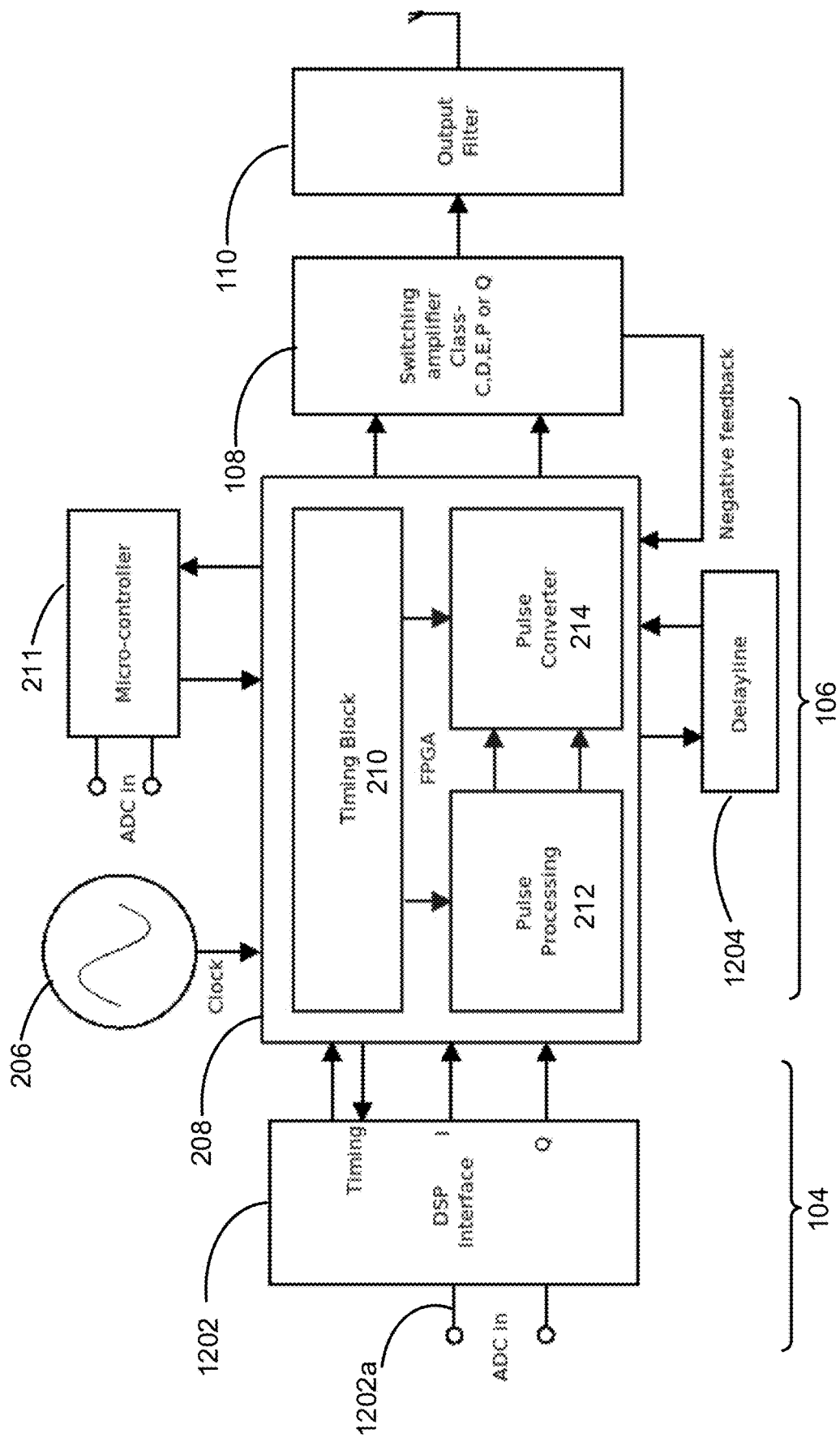
FIG. 12 is a block diagram of another power amplifier in accordance with an aspect of the disclosure.

In the embodiments described above, the in-phase modulator 202 and quadrature modulator 204 are configured to provide input signals to the integrated circuit 208. In another embodiment, the in-phase modulator 202 and quadrature modulator 204 are implemented in a digital signal processor (DSP). Referring to FIG. 12, the power amplifier is shown using the digital signal processor (DSP) 1202 as an interface to the integrated circuit 208. In this embodiment, the DSP 1202 receives analog signals at ADC inputs 1202a. The DSP 1202 digitally processes the converted input signals and outputs either an analog signal, using a digital-to-analog converter (DAC), or a logic output. Therefore, for example, the DSP 1202 can take an analog input and drive a PPM output into the integrated circuit to be amplified. In this embodiment, the DSP can output PPM or PWM pulses, one for the in-phase signal and one for the quadrature signal, that is synchronize with the timing of the integrated circuit 208.

Figure 13:
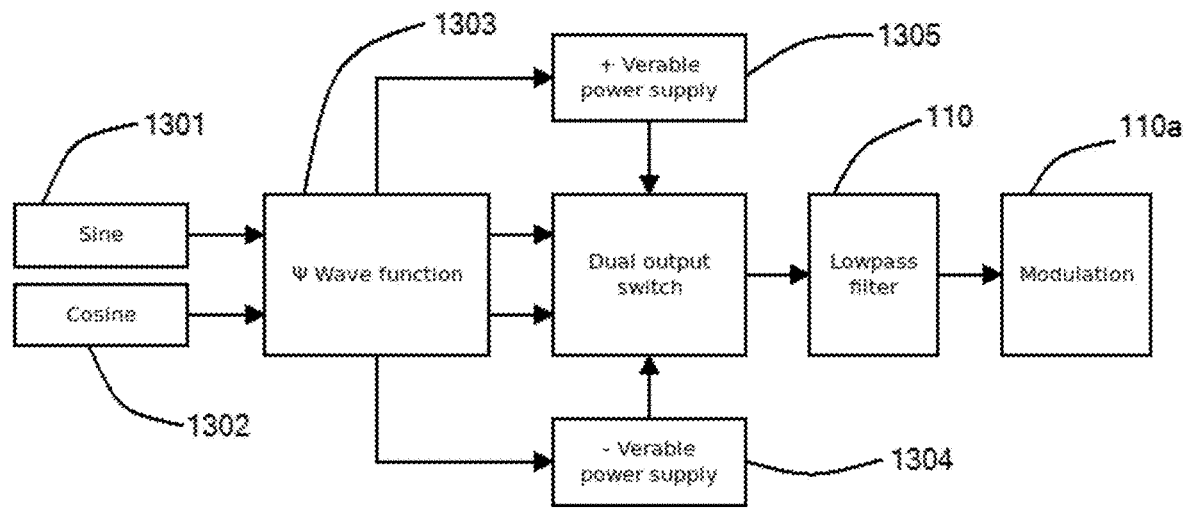
FIG. 13 is an alternate representation of a block diagram of the power amplifier.

The embodiments described above relate to a single vector design comprising two phase pulse modulators, one offset by 90° from the other. This arrangement makes it possible to generate quadrature amplitude modulation QAM Class Q. Referring to FIG. 13, a first modulator 1301 and a second modulator 1302 modulate an input sine wave and cosine wave, respectively, to generate a single vector from the master clock 206. A pulse processor 1303 converts the modulated pulses to a wave-function Psi (4V) using a processing block within the FPGA. The output of the pulse processor is sent to the switching device 108 for amplification, that could be any class of amplification, including Classes D, E, I, O, P or Q for example. A positive variable power supply 1305 and a negative variable power supply 1304 control the timing and frequency of the supplied power to the switching device 108 for Class G or Class H. Accordingly, it will be appreciated that FIG. 13 illustrates a similar idea to that shown in FIG. 1.

In the present embodiment, the processor stage 106, comprises more processing function logic blocks and is able to work with multiple inputs from the universal pulse converter 1401, making multiple vector processing possible. Each vector comprises an in-phase I, quadrature Q, envelope E, and phase P component. The switching network 108 includes the switching power supply and bias, which can be any switching device that has on/off states. The output 110 is combination of low-pass and/or band-pass design, that follows the switching devices, in the power/bias supply and the main output devices.

Figure 14:
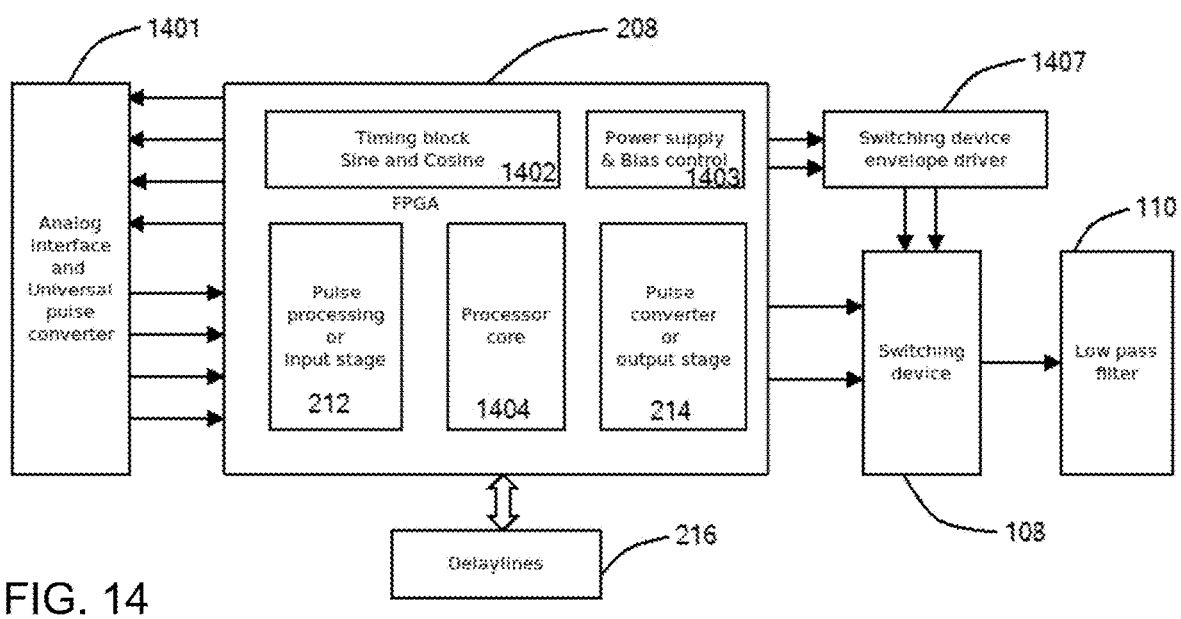
FIG. 14 is a block diagram of a power amplifier in accordance with an alternative aspect of the disclosure.

As illustrated in FIG. 14, multi-vectoring uses the same fundamental FPGA processing components as the embodiment for single vectors, with an extra processor core 1404 added between the pulse processor 212 and the pulse converter 214, and a bias/power supply driver 1403. One or more of the vector components, from a single vector or multiple vectors, are used to generate the desired pulse function depending on the modulation used. As will be appreciated, the in-phase signal I and the quadrature signal Q can be any phase, but they will have a sine, cosine relationship. The envelope will be 0° or 180° and the phase will be at 90° or 270°. The fundamental building block is PPM that can be used to contract the other three pulses such as PWM, ZPWM and PLM to provide the desired pulse function for the type of amplification used.

The processor core 1404 works with the inputs to build a desired pulse function. In an embodiment, the desired pulse function is input to the processor core 1404, which sets the particular amplifier class by setting the modulation of the universal pulse converter 1401.

Referring to FIG. 14, an alternate embodiment of the power amplifier is shown. To facilitate the wave-function components and multi-vector inputs, a universal pulse converter 1401 is implemented. The universal pulse converter 1401 employs a split phase analog network to facilitate analog input, as each analog input requires a mirrored wave-form that is equal but opposite. Thus, the universal pulse converter 1401 provides the functionality of both the decomposer 102 and the modulators 104 in the previously described embodiment. The universal pulse converter is configured to implement PPM, PLM, PWM and ZPWM on an analog input using an analog to digital converter.

A timing block 1402 provides sine and cosine master timing for all other components, as in-phase I and quadrature Q signals are offset by +/−90°. That follows first two of 0° and 90°, where these analog inputs are shifted by 180° providing in phase and out of phase copies of the 0° and 90° PPM signals. As with a single victor system the 180° and 270° can be generated with use of delay lines or operating at twice the wanted frequency, so therefore the timing input clock, phase shift networks and delay lines 216 are part of the integrated circuit 208. The processor core 1404 and the switching device envelope driver 1407 communicate to control the power supply and bias from the variable power supplies 1304 and 1305 to the switching device 108 for improved efficiency.

For example, for Class Q amplification a single vector input has one in-phase and one quadrature component, whereas a dual vector input has two in-phase and quadrature components. This pattern follows with multi vectors systems. By using more than one vector it is possible to assign a vector to do a set type of processing, such as linearity and efficiency for example. By combining the power supply and the amplifier stages it is possible to improve efficiency by using an envelope input. Another use of a dual vector system is controlling the output modulation. In this example, one vector generates an amplitude modulated (AM) signal and a second vector converts the AM signal to a Double sideband (DSB) signal.

Another advantage with multi vector processing is the ability to have the power supply driven by one of the vectors to optimize the switching efficiency. This is done by using PWM or ZPWM to generate an amplitude component or components, that uses a common clock to stay in sync with all other processing stages. By doing so, the positive and negative rails of the power supply and the switching amplifiers 108 are now two sides of the of the same process.

As previously noted, in Class P a minimum of four (4) pulses are required. However, as one of skill in the art will appreciate, in some cases an Intermediate Frequency (IF) offset may be required, for example; input clock/4 (to get 0, 90, 180, 270 degrees) with a positive or negative offset from the carrier frequency. Using dual vector processing provides a double balanced modulator configuration, over single balanced modulator used in class P and Q. This can be achieved using at least two vectors, and subtracting out the unwanted carrier.

As previously described, the pulse converter 214 may employ the Class G or H amplifier class in addition to the selected amplifier class. However, rather than using the pulse converter 214 to output a control signal to the switching network 108 to switch to a particular DC supply rail based on the voltage levels of the pulses, it can be built into the universal pulse converter 1401 with multi vector processing, using the envelope & phase of the signal.

In this embodiment, Class Q has a duty cycle of more than 0 to 25% of the input signal. This configuration can be used with Class O or multi-vector Class Q to subtract out the carrier if it is not required. In this embodiment, there are four time slots, each if which have a duty cycle of more than 25% per slot.

As previously discuss, for a Class O amplifier, the positive and negative identities are used to track the waveform of the input signal as it changes from positive to negative across the zero-crossing point. This transition is useful in working with single sideband (SSB) or double sideband (DSB), for example. That is, the transition is used by the processor core 1404 to identify the positive or negative parts of the analog waveform, so a mixer part of processor core 1404 can subtract out the carrier. Referring to FIG. 17, a dual vector RF output from a Class O function block in balanced mixer configuration, highlights how the zero crossing can be used to remove the RF carrier. Accordingly, it will be appreciated that the positive and negative identities become part of dual/multi vector processing configurations. In such an implementation, the dual analog inputs are 0° and 180° shifted from each other to facilitate addition and subtraction of the vectors. Although a minimum of two vectors are required to form a balanced mixer or modulator, other vectors can also be used in controlling linearity and efficiency for example.

As previously noted, the system is not limited to dual vectors, but further vectors can be used to provide a wider range of possible processing combinations, as may be required with some advanced forms of digital modulation systems, such as orthogonal frequency division multiplexing OFDM.

Wave-functions are used to differentiate between the two types of information, one is the pulses that is been processed within logic gates (FPGA) and the other that become modulation after the low pass filter. By understanding the wave function Psi (4V) it is possible to do multistage processing using logic gates and keep the signal analog within a digital environment. This process can work both ways taking the wave-function and going to modulation or taking a modulated signal and going to the wave-function. This is where the processing side of the amplifier is the analog digital modulator (ADM). This is how all the low-level processing is done within the FPGA, building up the wanted wave-functions.

Referring to FIG. 16*a*, a graphical representation of the different classes of amplifiers is shown. In the representation, the outer ring of the circle represents amplifier efficiency. Analog amplifiers are illustrated by 1601 and switching amplifiers are illustrated by 1602. It is possible to show how all amplifiers are related to each other with use of these amplifier circles.

The pulse type used will set the pulse function, as illustrated in FIG. 16*b*. To better differentiate between the pulse types and modulation, the wave-function is used to describe what is happening before the low pass filter stage 110. The amplification types are built on four base types Class D, Class E, Class O, and Class Q and how these pulses work together to generate the wanted waveform. Typically, PWM modulation is used to implement Class D, PLM modulation is used to implement Class E, ZPWM modulation is used to implement Class O, and PPM modulation is used to implement Class Q that is asymmetrical. In Class D the PWM pulse becomes wider from the center point and narrower returning to the starting point. In Class O the ZPWM pulse starts from each edge becoming wider and narrower to return back to the starting point. Both pulse functions will carry amplitude information, but only Class O includes the identity information. In Class E, the PLM pulse location moves from side to side with a consistent width to carry phase information. In Class Q, the pulses are asymmetrical, that changes with width and position within a time slot. This is how Class Q is able to amplify QAM that has amplitude and phase information. By adding in Class O, it is possible to remove the carrier leaving DSB that maintains the amplitude and phase information.

As illustrated in Table 1 below, by using different pulse functions it possible to build any form of modulation by changing the wave-function from the four building blocks PWM, ZPWM, PLM and PPM, alongside controlling the power and bias supply rails. It is also possible to shift the input clock 206 in frequency or phase, to provide for a larger phase or frequency shift within the modulated wave-form.

TABLE 1

| Modulation | Pulse function | Direction | Operator | Direction |
|---|---|---|---|---|
| PPM | Phase | Left | OR | Right |
| PLM | Phase | Left | AND | Right |
| PWM | Amplitude | Up | OR | Down |
| ZPWM | Amplitude | Up | AND | Down |

With class O it has a number of configurations standard as with classes D and E or it can be in a quadrature form requiring four inputs.

For example, a Class O amplifier can work with a Class D amplifier to provide positive and negative forms in audio HiFi amplification, where the output is taken from each side of the steering gates 1505 and 1506 to drive output switching devices. As another example, a Class O amplifier can be used to determine a difference between two Class Q signals from each other using dual vector processing. This can be achieved by using two Class Q stages in parallel and subtracting the carrier using the Class O. This makes the Class O amplifier very flexible in how it could be used as a logic processing block. In quadrature configuration has four phase angles 0°, 90°, 180° and 270° and is setup as a double balanced modulator, leaving the two side bands where one can be then phased out for SSB or as a standalone AF/RF amplifier.

Further, prototype tests have been done with Digital Radio Mondiale (DRM) and SSB, showing it is possible to operate in a double balanced configuration in direct and offset modes. There are two balanced modulator modes that have been tested, one is canted on the carrier frequency (DSB with upper and lower side bands) and the other that has an IF Intermediate Frequency offset (for example 12 kHz above the carrier frequency when testing with DRM), as shown in FIG. 17 output spectrum plot.

Where standard Class Q operates in a single balanced configuration for QAM or for testing in C-QuAM, by combining Class Q and Class O together it is possible to operate in quadrature and in a balanced output state. Since Class O is implemented using an XOR gate, it also can be used as a frequency multiplier as well as a standalone amplifier, where negative feedback may be used to eliminate the unwanted harmonics. In a double balanced configuration, there is an extra processing step that takes a form of a mixer to convert the input signal onto the wanted frequency, used within the processor core 1404.

Further, it is possible to increase the resolution of the amplifier by increasing the number of time slots used to sample the input signal. That is, rather than using four offsets of 0°, 90°, 180°, and 270°, or $\pi/2$, $\pi$, $3\pi/2$ and $2\pi$, the number of offsets can be any value (x) to the power of two ($x^2$), where x is greater than or equal to 2. Thus, the number of offsets can be 4, 8, 16, 32 and the like, as long as it possible to have both sine and cosine components. This can be implemented using a Johnson ring counter within the timing block 1402. As will be appreciated, more bits used in the ring counter, the higher the resolution. When increasing the resolution, it should be the speed of the universal pulse phase modulators should be taking into consideration to ensure that they can operate fast enough to sample the smaller area of the waveform. The increased resulting can also be used to compare two pulses when they cross a preset point in time, for example with PLM to assign identities when tracking the phase.

Although embodiments have been described above and are shown in the accompanying drawings, it will be appreciated by one of skill in the art that variations and modifications may be made without departing from the scope as defined by the appended claims, and the scope of the claims should be given the broadest interpretation consistent with the specification as a whole.

Although forms have been described above and are shown in the accompanying drawings, it will be appreciated by one of skill in the art that variations and modifications may be made without departing from the scope as defined by the appended claims, and the scope of the claims should be given the broadest interpretation consistent with the specification as a whole.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A power amplifier comprising:
 a universal pulse converter configured to:
  receive at least one analog input; and
  modulate an in-phase component of the at least one analog input and a quadrature component of the at least one input signal;
 a processor configured to process the in-phase and quadrature components, the processor comprising:
  a clock configured to produce a clock signal;
  a pulse processor configured to remove non-essential information from the modulated in-phase and quadrature components; and
  a pulse converter configured to output a control signal based on a selected amplifier class; and
 a switching network configured to actuate one or more switches based on the control signal to output an amplified signal.

2. The power amplifier of claim 1, wherein the universal pulse converter is configured to apply at least one of pulse phase modulation (PPM), pulse width modulation (PWM), pulse location modulation (PLM), and zero-crossing pulse width modulation (ZPWM).

3. The power amplifier of claim 1, wherein the pulse processor is configured to remove mirrored information from the modulated in-phase and quadrature components.

4. The power amplifier of claim 1, wherein the amplifier class is any one of Class D, Class E, Class O, Class P and Class Q.

5. The power amplifier of claim 4, wherein when the amplifier class is Class C, the pulse converter is configured to output the control signal to actuate the switching network to output the modulated in-phase component as the amplified signal.

6. The power amplifier of claim 4, wherein when the amplifier class is Class D, the pulse converter is configured to output the control signal to actuate the switching network to output the modulated quadrature component as the amplified signal.

7. The power amplifier of claim 4, wherein when the amplifier class is Class E, the pulse converter is configured to: control the in-phase and quadrature modulators to not apply any modulation; and
 output the control signal to actuate the switching network to output the in-phase and quadrature components as the amplified signal.

8. The power amplifier of claim 4, wherein when the amplifier class is Class O, the pulse converter is configured to modulate in-phase and out of phase inputs signals, and logically combine the modulated in-phase and out of phase inputs signals to determine positive and negative identities.

9. The power amplifier of claim 8, wherein the modulated in-phase and out of phase signals are logically combined by:
 inputting the modulated in-phase and out of phase signals to an XOR to produce an output;
 inputting the modulated in-phase signal along with the output of the XOR gate to a first AND gate to provide a positive identity; and
 inputting the modulated out of phase signal along with the output of the XOR gate to a second AND gate to provide a negative identity.

10. The power amplifier of claim 4, wherein the processor further comprises a first delay circuit configured to output a first delay signal to the pulse converter.

11. The power amplifier of claim 10, wherein the essential information of the modulated in-phase component forms a first signal, and wherein the pulse converter is configured to apply the first delay signal to the first signal to produce a third signal.

12. The power amplifier of claim 11, wherein the essential information of the modulated quadrature component forms a second signal, and wherein the pulse converter is configured to apply the first delay signal to the second signal to produce a fourth signal.

13. The power amplifier of claim 12, when the amplifier class is Class P, the pulse converter is configured to output the control signal to actuate the switching network to output the first signal, second signal, third signal and fourth signal in a repeating signal as the amplified signal.

14. The power amplifier of claim 12, wherein when the amplifier class is Class Q, the pulse converter is configured to output the control signal to actuate the switching network to output a combination of the first and second signals, and a combination of the third and fourth signals in a repeating signal as the amplified signal.

15. The power amplifier of claim 1, further comprising:
 an output filter configured to filter the amplified signal output by the switching network.

16. The power amplifier of claim 1, wherein the clock is configured to produce the clock signal having a resolution of $x^2$, where x is greater than or equal to 2.

17. The power amplifier of claim 16, wherein the clock is implemented using a Johnson ring counter.